US012614587B2

(12) United States Patent
Mizushima et al.

(10) Patent No.:    US 12,614,587 B2
(45) Date of Patent:        Apr. 28, 2026

(54) RESISTANCE CHANGE ELEMENT, STORAGE DEVICE, AND NEURAL NETWORK APPARATUS

(71) Applicant: KABUSHIKI KAISHA TOSHIBA, Tokyo (JP)

(72) Inventors: Koichi Mizushima, Kamakura Kanagawa (JP); Yoshifumi Nishi, Yokohama Kanagawa (JP); Kumiko Nomura, Tokyo (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 75 days.

(21) Appl. No.: 18/584,183

(22) Filed: Feb. 22, 2024

(65) Prior Publication Data

US 2025/0029654 A1      Jan. 23, 2025

(30) Foreign Application Priority Data

Jul. 21, 2023     (JP) ................................. 2023-119267

(51) Int. Cl.
G11C 13/00            (2006.01)
(52) U.S. Cl.
CPC ........ G11C 13/0011 (2013.01); G11C 13/004 (2013.01); G11C 13/0069 (2013.01); *G11C 2213/11* (2013.01); *G11C 2213/31* (2013.01)
(58) Field of Classification Search
None
See application file for complete search history.

(56) References Cited

U.S. PATENT DOCUMENTS 10,175,947 B1     1/2019  Marukame et al.
10,853,721 B2    12/2020  Mori et al.
(Continued)

FOREIGN PATENT DOCUMENTS

JP          2018-120433 A      8/2018
JP          2019-53563 A       4/2019
(Continued)

OTHER PUBLICATIONS

Takao Marukame, et al., "Lithium-ion-based resistive devices of LiCoO$_2$/LiPON/Cu with ultrathin interlayers of titanium oxide for neuromorphic computing," IEEE J. Electron Devs. Soc., Special Issue, 9 pages, DOI:10.1109/JEDS.2023.3265392 (2023).
(Continued)

*Primary Examiner* — Alfredo Bermudez Lozada
(74) *Attorney, Agent, or Firm* — Finnegan, Henderson, Farabow, Garrett & Dunner, LLP

(57)                ABSTRACT

According to one embodiment, a resistance change element includes a first electrode, a second electrode, a first transition metal compound layer provided between the first electrode and the second electrode and including lithium ions in lattice site locations, a second transition metal compound layer provided between the first transition metal compound layer and the second electrode and including the lithium ions in the lattice site locations, and a lithium ion conductor layer provided between the first transition metal compound layer and the second transition metal compound layer and being a solid material allowing the lithium ions to pass therethrough and resistant to electrons.

16 Claims, 13 Drawing Sheets

(56)                References Cited

U.S. PATENT DOCUMENTS

| | | | |
|---|---|---|---|
| 10,891,108 | B2 | 1/2021 | Marukame et al. |
| 11,146,075 | B2 | 10/2021 | Chae et al. |
| 11,380,375 | B2 | 7/2022 | Marukame et al. |
| 11,526,738 | B2 | 12/2022 | Marukame et al. |
| 11,636,315 | B2 | 4/2023 | Marukame et al. |
| 11,777,006 | B2 | 10/2023 | Mizushima et al. |
| 2019/0156181 | A1 | 5/2019 | Marukame et al. |
| 2020/0293861 | A1 | 9/2020 | Marukame et al. |
| 2020/0302274 | A1 | 9/2020 | Marukame et al. |
| 2020/0380347 | A1 | 12/2020 | Marukame et al. |
| 2020/0411760 | A1* | 12/2020 | Kurita ............... H10N 70/8416 |
| 2021/0279559 | A1 | 9/2021 | Nishi et al. |
| 2022/0083845 | A1 | 3/2022 | Marukame et al. |
| 2022/0138547 | A1 | 5/2022 | Saito et al. |
| 2022/0215229 | A1 | 7/2022 | Nishi et al. |
| 2022/0237452 | A1 | 7/2022 | Marukame et al. |
| 2022/0300792 | A1 | 9/2022 | Marukame et al. |
| 2023/0079071 | A1 | 3/2023 | Marukame et al. |
| 2023/0305806 | A1 | 9/2023 | Marukame et al. |

FOREIGN PATENT DOCUMENTS

| | | |
|---|---|---|
| JP | 2019-95860 A | 6/2019 |
| JP | 2020-13398 A | 1/2020 |
| JP | 2020-17114 A | 1/2020 |
| JP | 2020-197922 A | 12/2020 |
| JP | 2021-47530 A | 3/2021 |
| JP | 2021-111142 A | 8/2021 |
| JP | 2021-140320 A | 9/2021 |
| JP | 2022-37319 A | 3/2022 |
| JP | 2022-49425 A | 3/2022 |
| JP | 2022-72401 A | 5/2022 |
| JP | 2022-106592 A | 7/2022 |
| JP | 2022-114793 A | 8/2022 |
| JP | 2022-129104 A | 9/2022 |
| JP | 2022-142604 A | 9/2022 |
| JP | 2023-43142 A | 3/2023 |
| JP | 2023-93207 A | 7/2023 |
| JP | 2023-140136 A | 10/2023 |
| WO | WO 2019/187032 A1 | 10/2019 |

OTHER PUBLICATIONS

Michael G. Verde, et al., "Elucidating the Phase Transformation of $Li_4Ti_5O_{12}$ Lithiation at the Nanoscale," ACS Nano Publications, vol. 10, pp. 4312-4321 (2016).

Juan Carlos Gonzalez-Rosillo, et al., "Lithium-Battery Anode Gains Additional Functionality for Neuromorphic Computing through Metal-Insulator Phase Separation," Adv. Mater., vol. 32, 27 pages, DOI:10.1002/adma.201907465 (2020).

Kazuhiko Mukai, et al., "Understanding the Zero-Strain Lithium Insertion Scheme of Li $[Li_{1/3}Ti_{5/3}]O_4$: Structural Changes at Atomic Scale Clarified by Raman Spectroscopy," J. Phys. Chem. C, vol. 118, pp. 2992-2999, DOI:doi.org/10.1021/jp412196v (2014).

Naoki Nitta et.al., "Li-ion battery materials: present and future," Materials Today, vol. 18, No. 5, pp. 252-264, DOI: 10.1016/j.mattod. 2014.10.040 (2015).

Xia Lu et al., "Lithium Storage in Li 4 Ti 5 0 12 Spinel: The Full Static Picture from Electron Microscopy," Adv. Mater., vol. 24, pp. 3233-3238, DOI: 10.1002/adma.201200450 (2012).

Hui Xu et al., "Fabrication of $Li_4Ti_5O_{12}$-$TiO_2$ Nanosheets with Structural Defects as High-Rate and Long- Life Anodes for Lithium-Ion Batteries," Scientific Reports, vol. 7, No. 2960, 10 pages, DOI: 10.1038/s41598-017-03149-2 (2017).

Japan Patent Office, Decision to Grant in JP App No. 2023-119267 (Feb. 3, 2026).

Japan Patent Office, Office Action in JP App No. 2023-119267 (Dec. 16, 2025).

\* cited by examiner

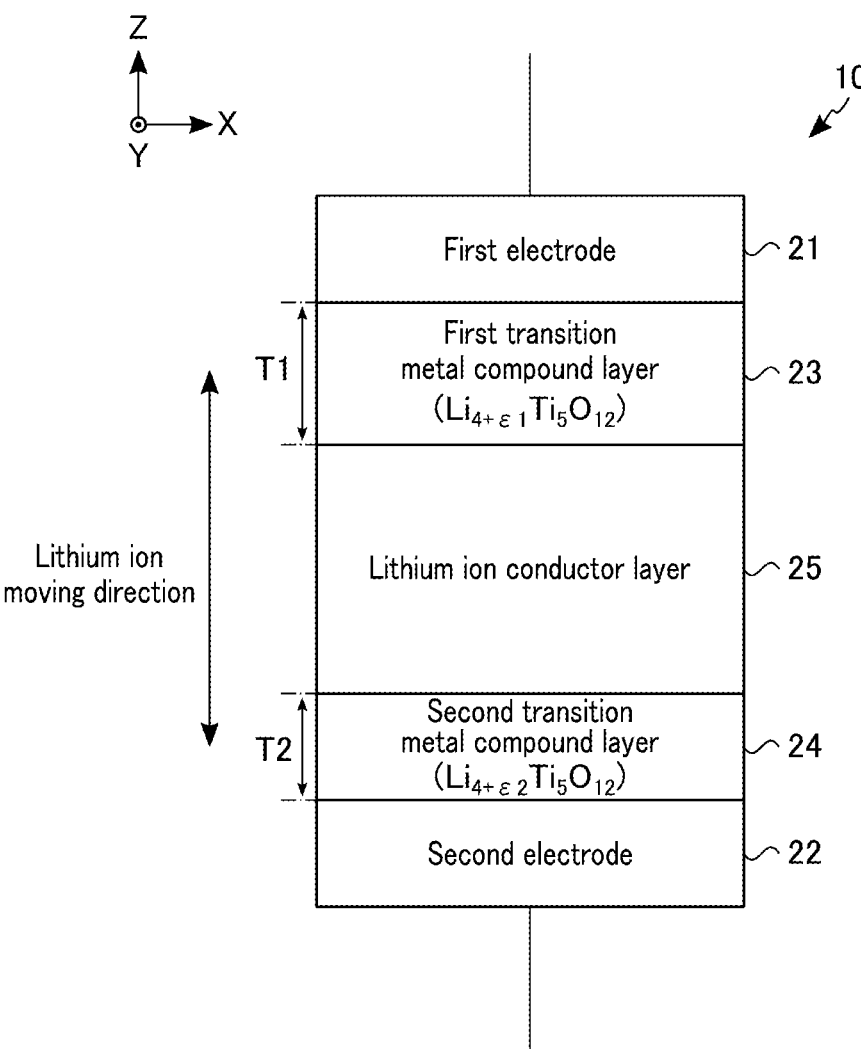
F I G. 1

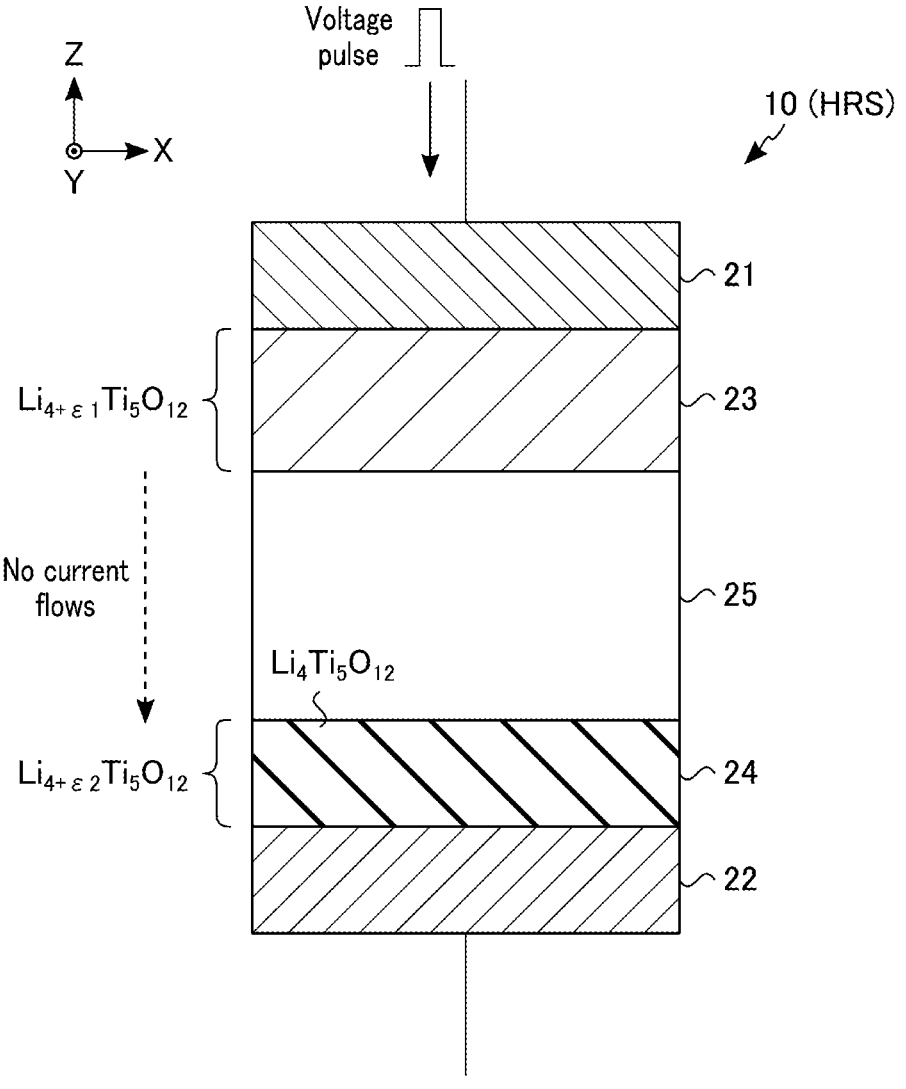
F I G. 3

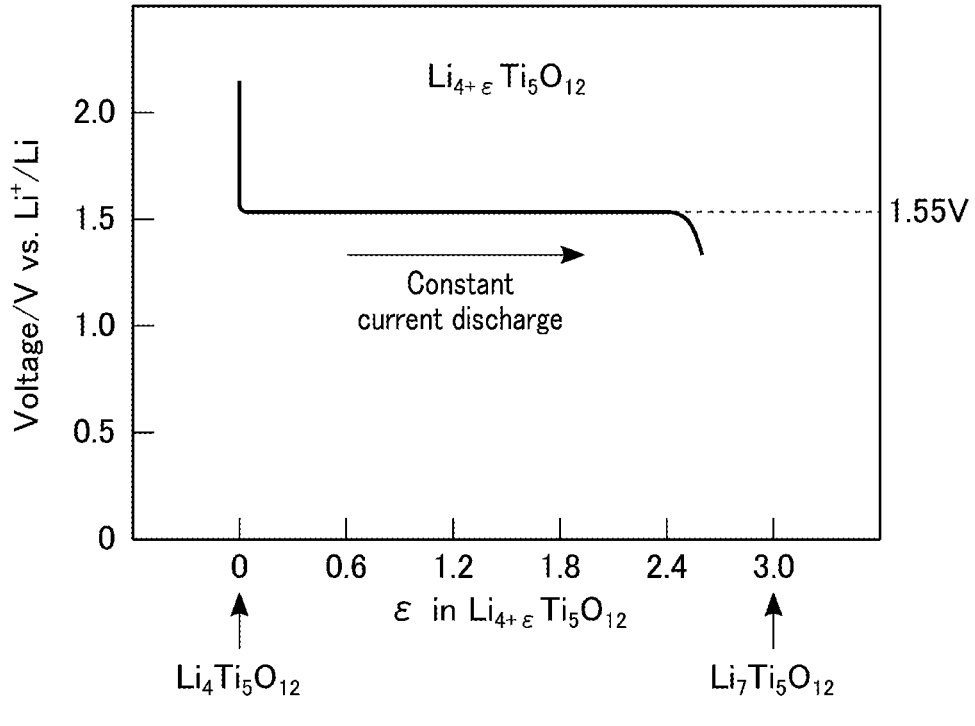
F I G. 4

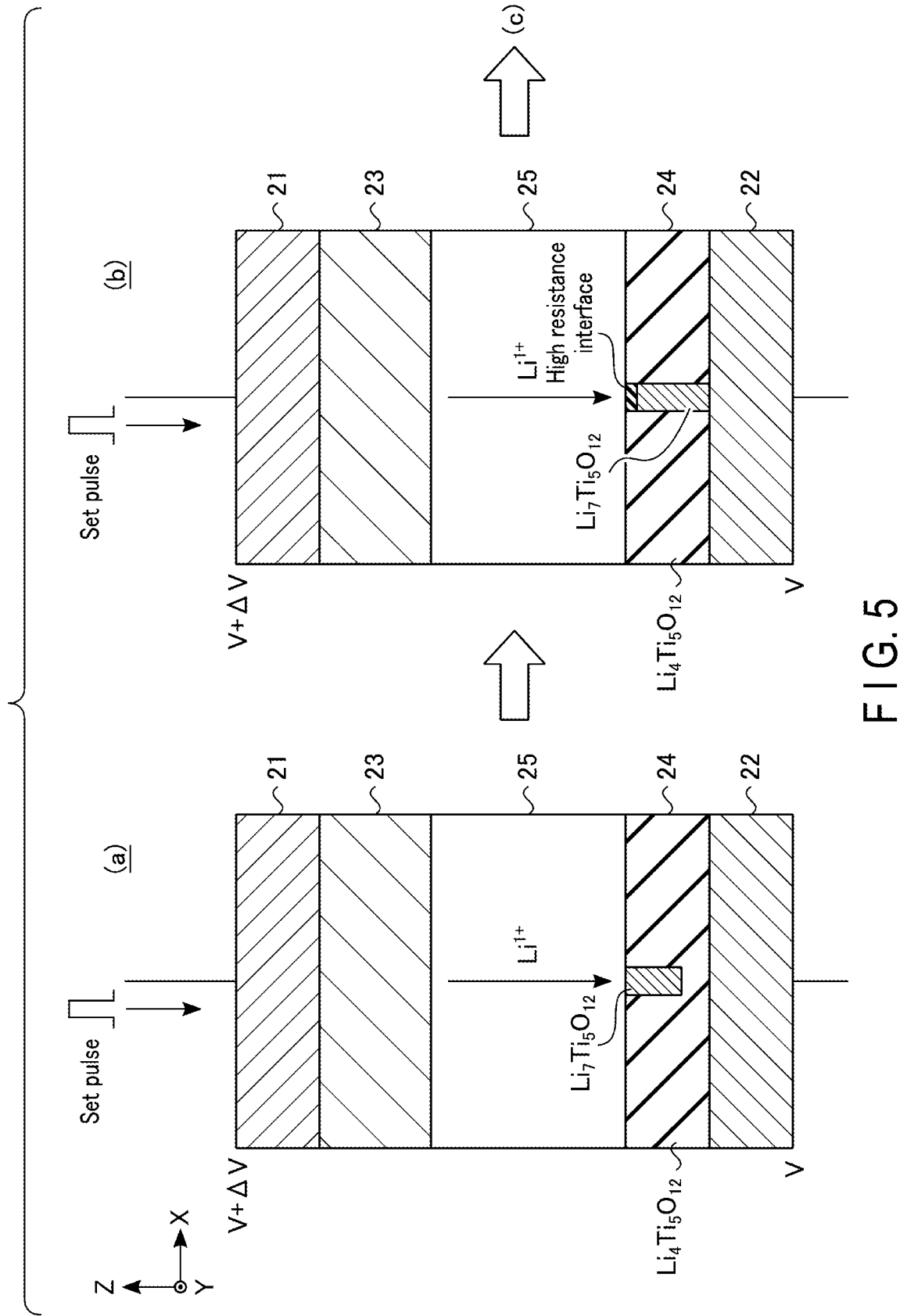
F I G. 5

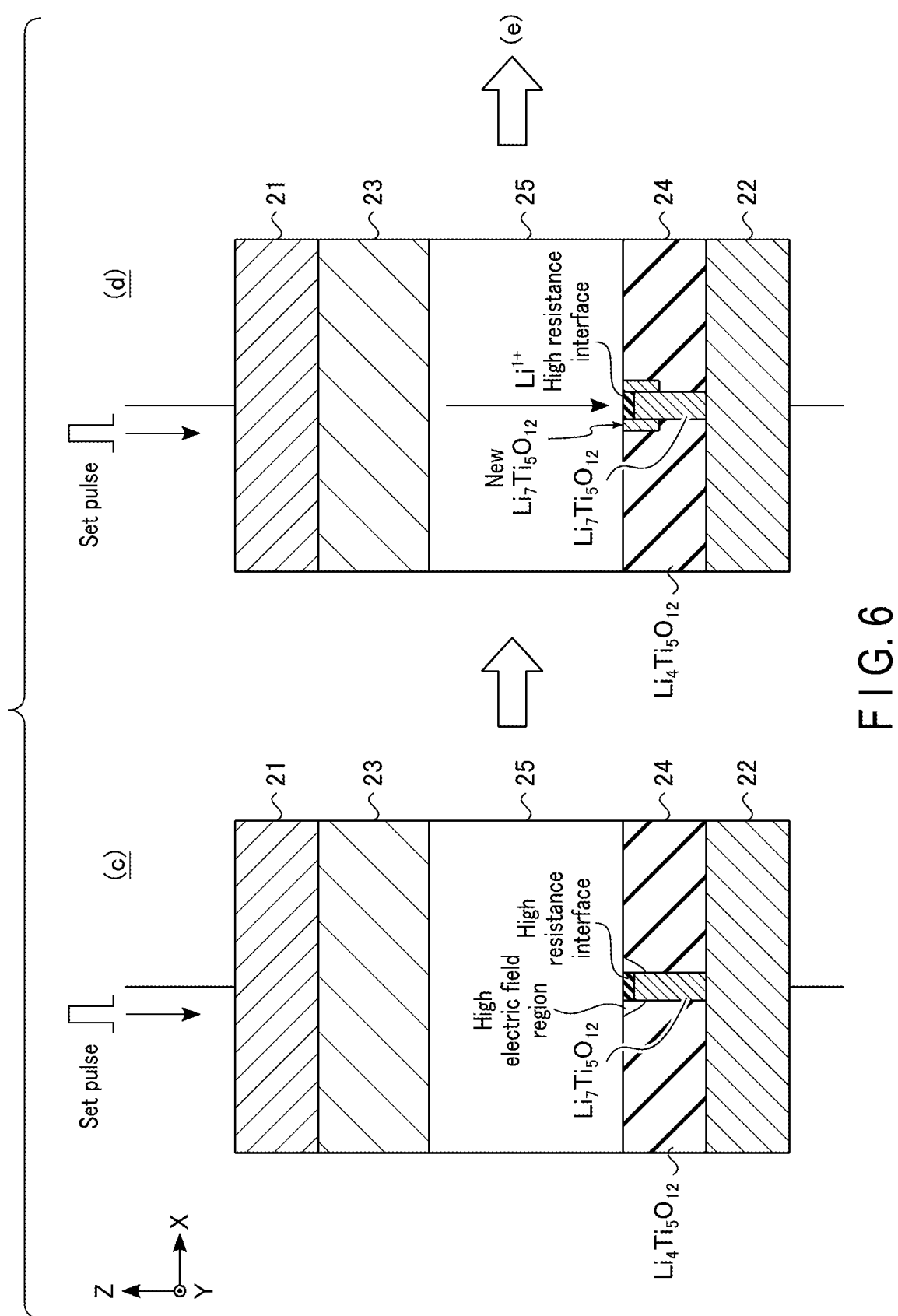
F I G. 6

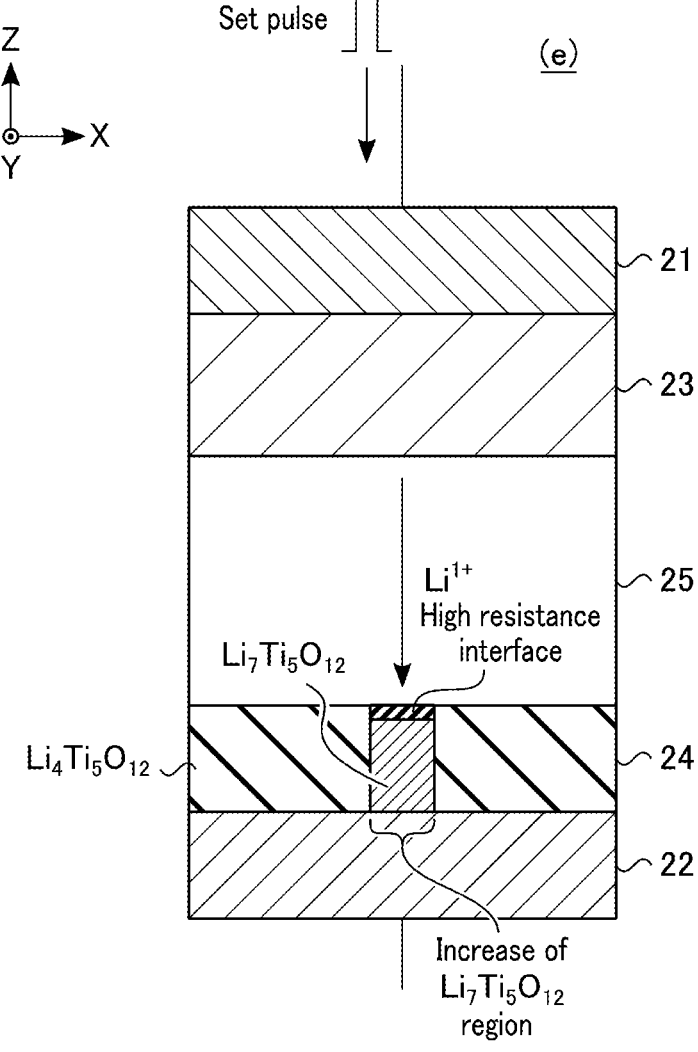
F I G. 7

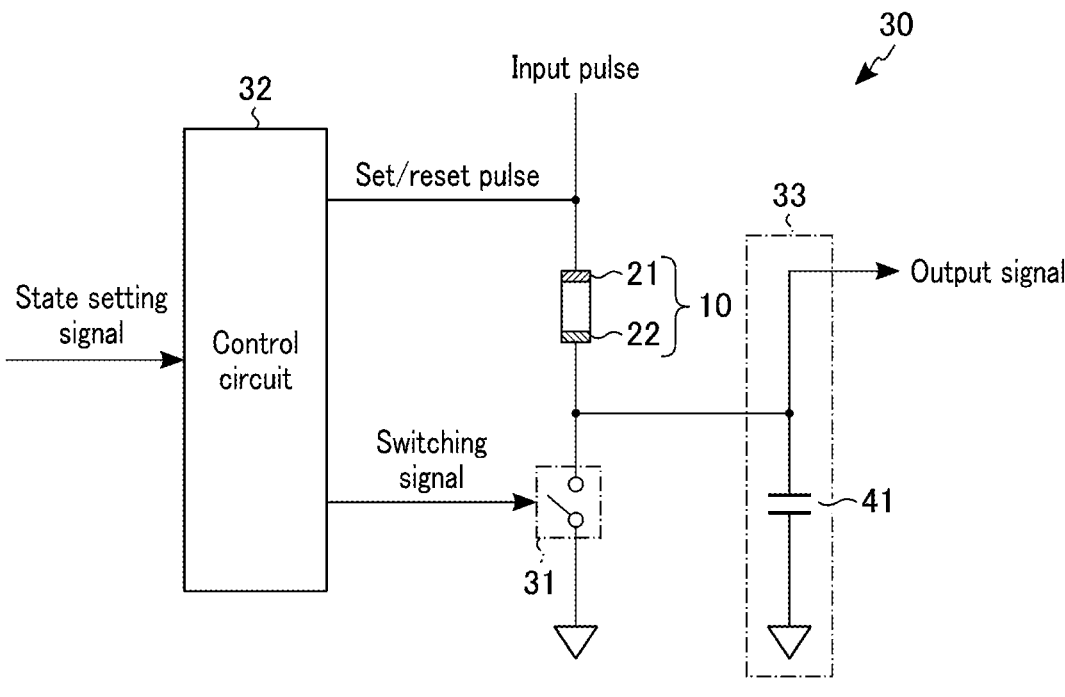
F I G. 9
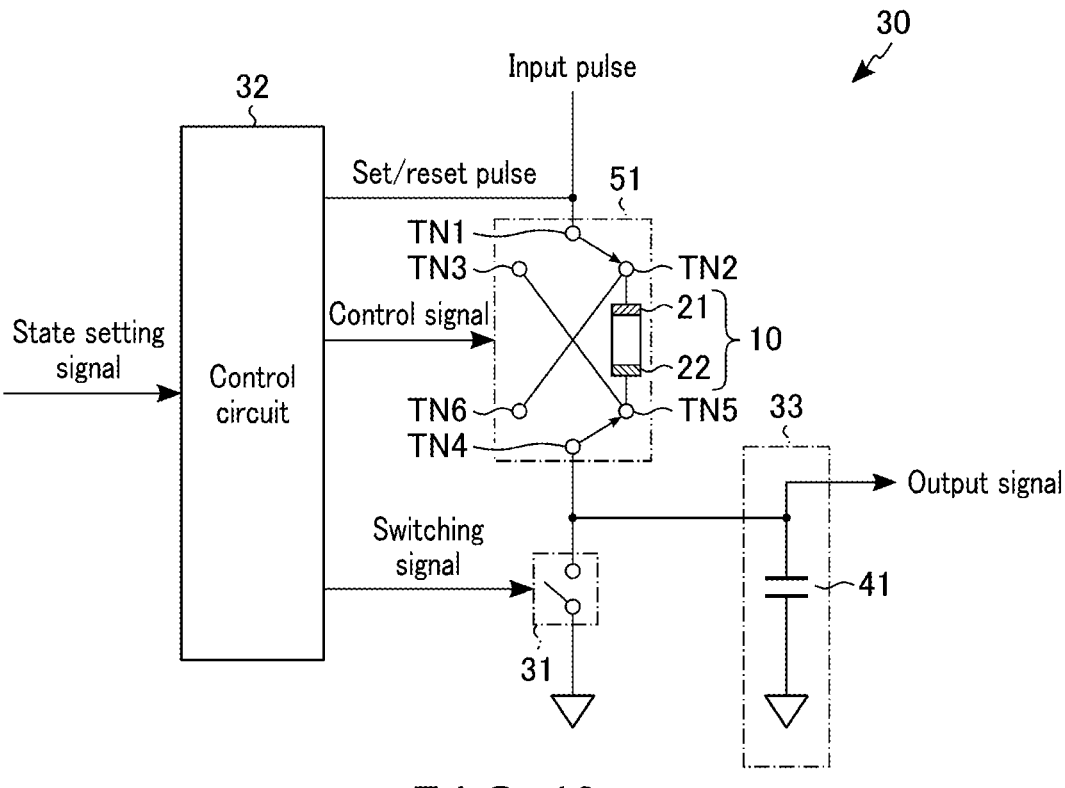
F I G. 10

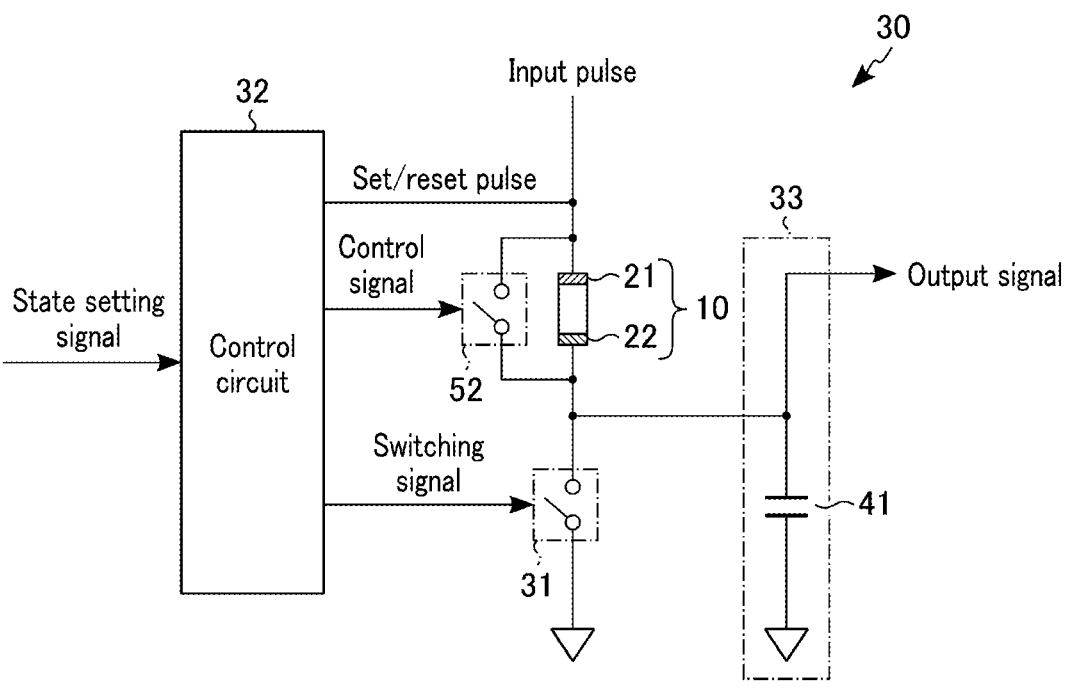
F I G. 11
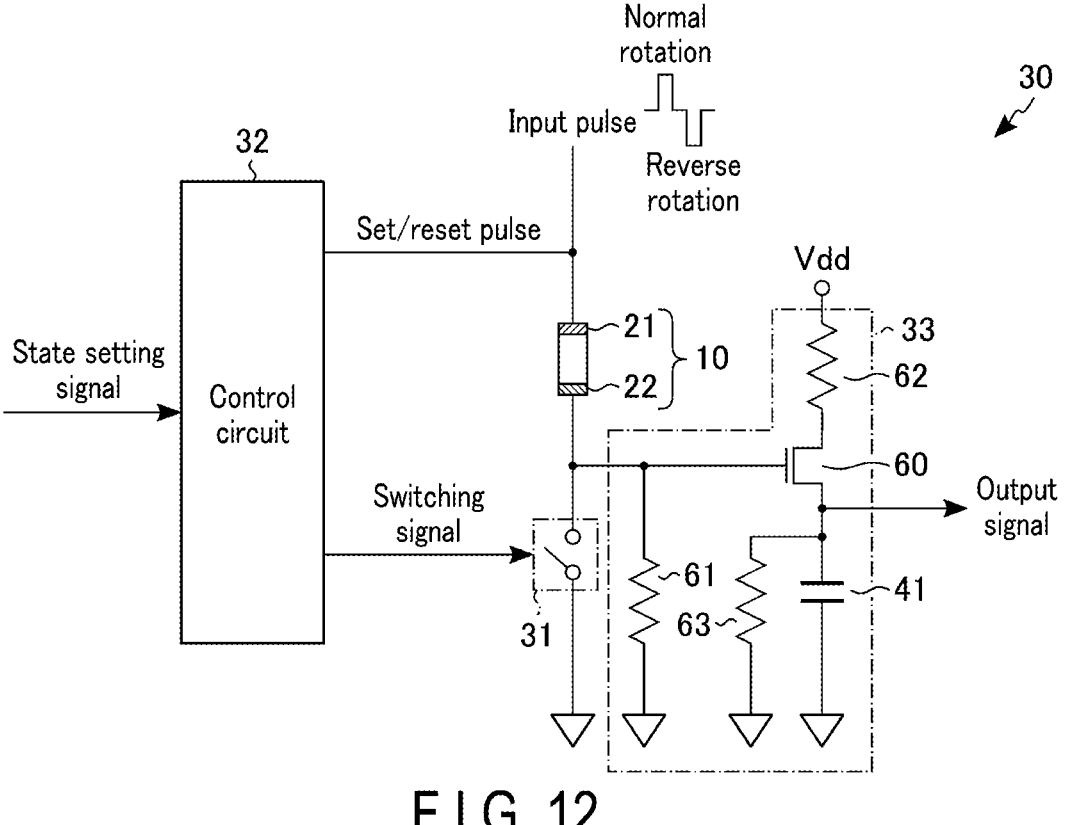
F I G. 12

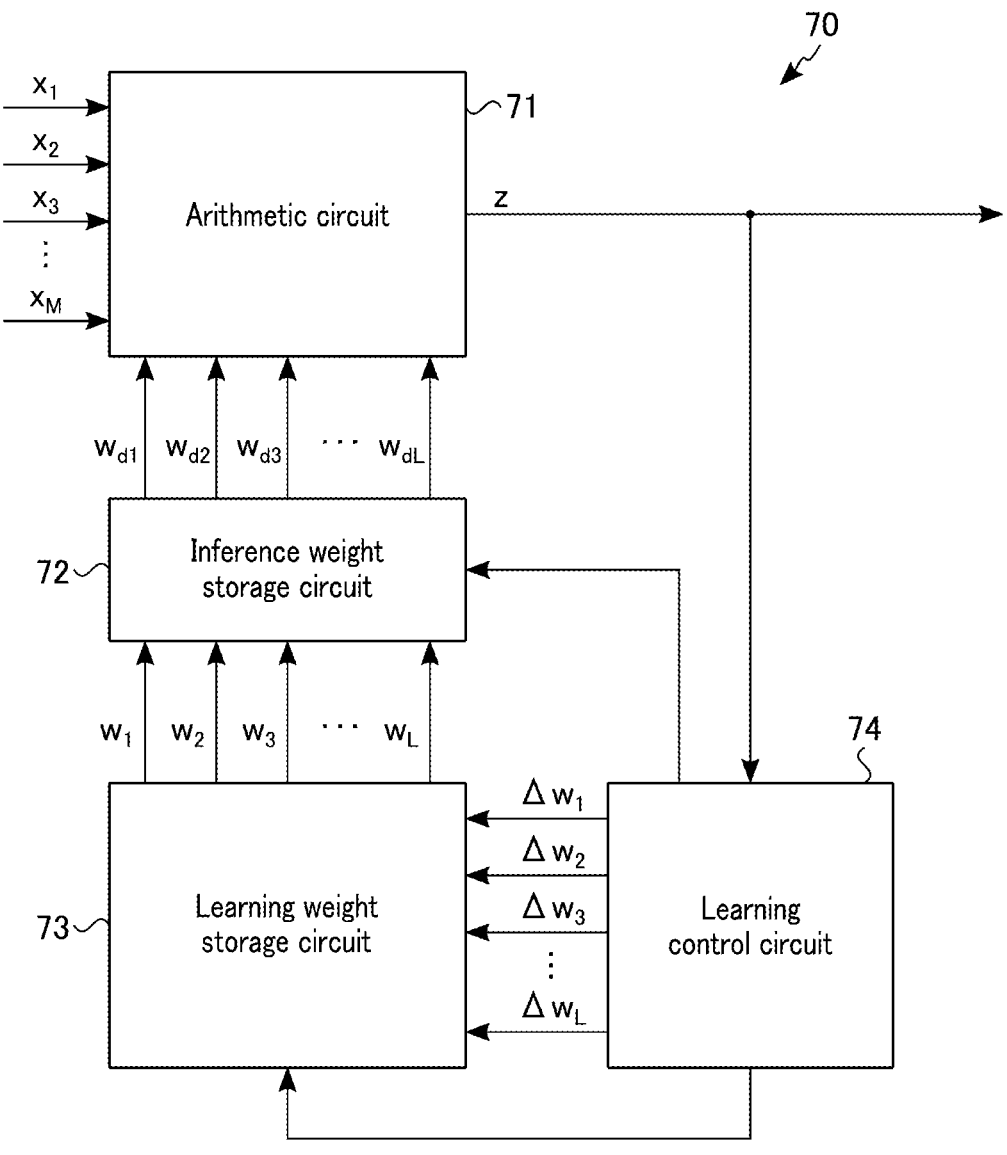
F I G. 13

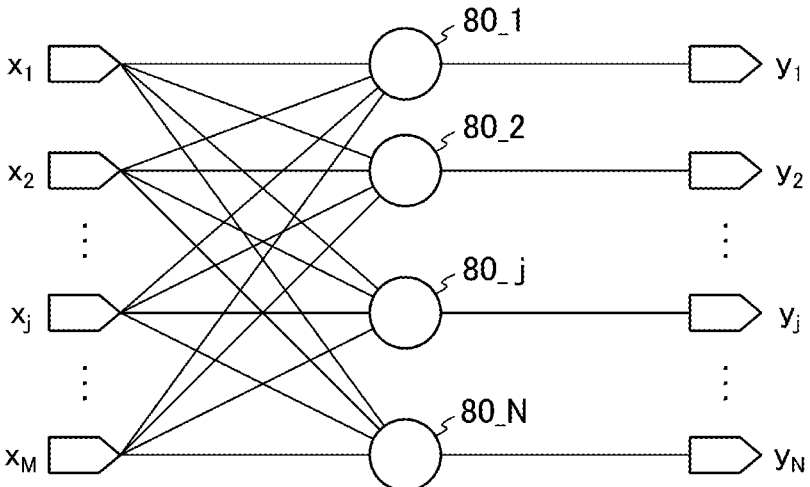
F I G. 14
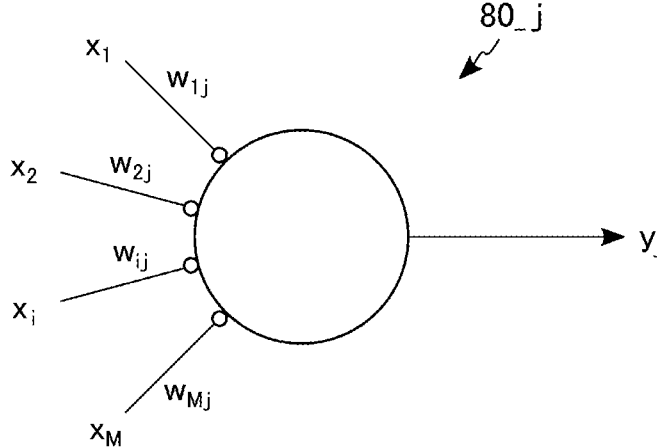
F I G. 15

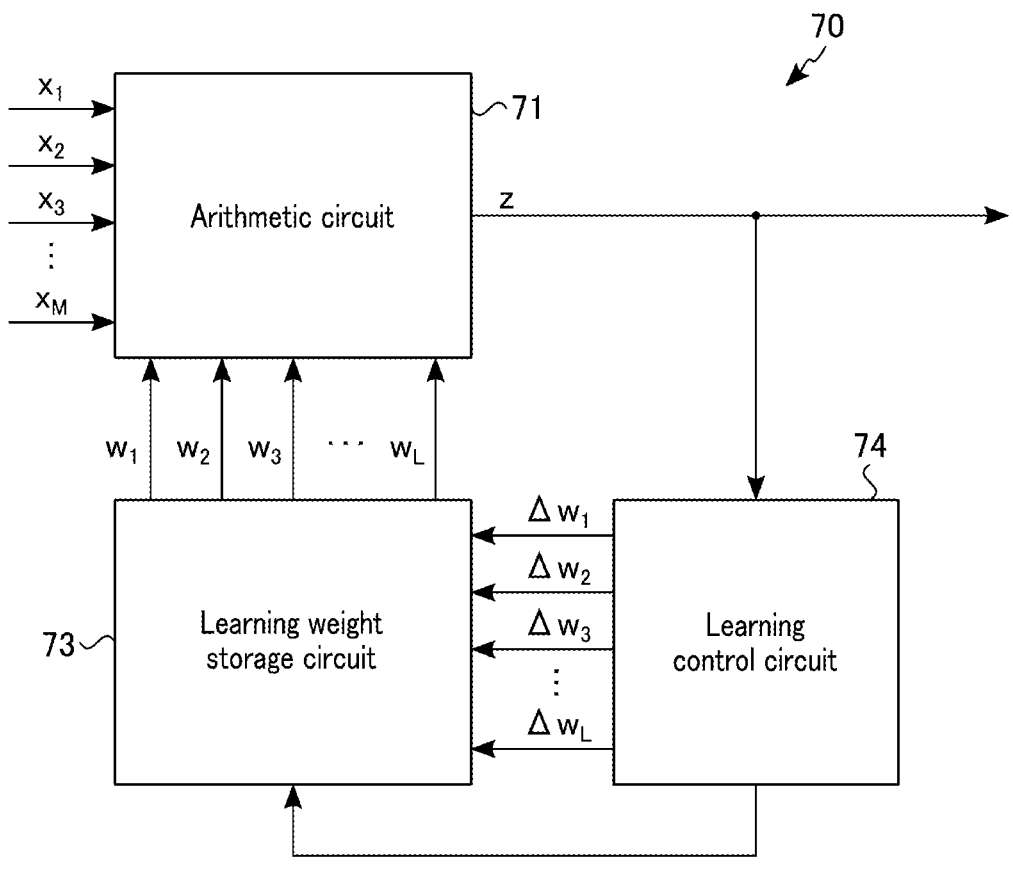
F I G. 16

RESISTANCE CHANGE ELEMENT, STORAGE DEVICE, AND NEURAL NETWORK APPARATUS

CROSS-REFERENCE TO RELATED APPLICATION

This application is based upon and claims the benefit of priority from prior Japanese Patent Application No. 2023-119267, filed Jul. 21, 2023, the entire contents of which are incorporated herein by reference.

FIELD

Embodiments described herein relate generally to a resistance change element, a storage device, and a neural network apparatus.

BACKGROUND

In recent years, neural network apparatuses realized with hardware have been researched. Neuromorphic neural networks imitating human brains, that is, brain type neural networks are known. Brain type neural networks are neural networks operating with low energy consumption and imitating human brains with high error resistance.

In the field of brain type neural networks, development of new hardware is desired as well as algorithms. In development of hew hardware, it is desired to develop novel resistance change type nonvolatile memories. In conventional art, various resistance change type nonvolatile memories (ReRAM: Resistive Random Access Memory) have been proposed as elements for neuron or synapse circuits. However, resistance change type nonvolatile memories of any type have large variations in characteristics between elements. For this reason, no large-sized brain type neural networks using resistance change type nonvolatile memories have been developed.

For example, one element known as one of conventional ReRAMs has a structure in which metal electrodes are provided on both ends of a transition metal oxide, such as $TiO_2$. In a ReRAM with such a structure, an amount or distribution of oxygen deficiency existing in the transition metal oxide is changed by applying a voltage or current pulse between the metal electrodes. A ReRAM with such a structure changes to a low resistive state (LRS), if oxygen deficiency in the transition metal oxide increases, because electrons are introduced to a part in the vicinity of the oxygen deficiency to maintain electrical neutrality. In contrast, if oxygen deficiency in the transition metal oxide decreases, a ReRAM with such a structure changes to a high resistive state (HRS). However, ReRAMs with such a structure have large variations in characteristics. For this reason, difficulty exists in applying ReRAMs with such a structure to large-sized brain type neural networks. In recent years, although thin-film battery type ReRAMs using lithium ions instead of oxygen deficiency have been proposed, they require further improvement in element linearity and/or repetition characteristics.

BRIEF DESCRIPTION OF THE DRAWINGS

FIG. 1 is a diagram illustrating an example of a cross-sectional structure of a resistance change element according to a first embodiment.

FIG. 3 is a diagram illustrating an example in a case where the resistance change element according to the first embodiment is in a high resistive state.

FIG. 4 is a diagram illustrating electromotive force against metal lithium in discharge of a transition metal compound $Li_{4+\varepsilon}Ti_5O_{12}$ ($0<\varepsilon<3$).

FIG. 5 is a diagram illustrating a state change of a second transition metal compound layer in a case where a set pulse is applied to the resistance change element according to the first embodiment.

FIG. 6 is a diagram illustrating a state change of the second transition metal compound layer in the case where a set pulse is applied to the resistance change element according to the first embodiment.

FIG. 7 is a diagram illustrating a state change of the second transition metal compound layer in the case where a set pulse is applied to the resistance change element according to the first embodiment.

FIG. 9 is a diagram illustrating an example of a configuration of a storage device according to a second embodiment.

FIG. 10 is a diagram illustrating an example of a configuration of a storage device according to a third embodiment.

FIG. 11 is a diagram illustrating an example of a configuration of a storage device according to a fourth embodiment.

FIG. 12 is a diagram illustrating an example of a configuration of a storage device according to a fifth embodiment.

FIG. 13 is a diagram illustrating an example of a configuration of a neural network apparatus according to a sixth embodiment.

FIG. 14 is a diagram for explaining a layer of a neural network in the neural network apparatus according to the sixth embodiment.

FIG. 15 is a diagram explaining a sum-of-product arithmetic operation with a sum-of-product arithmetic circuit included in the neural network apparatus according to the sixth embodiment.

FIG. 16 is a diagram illustrating an example of a configuration of a neural network apparatus according to a seventh embodiment.

DETAILED DESCRIPTION

Figure 2:
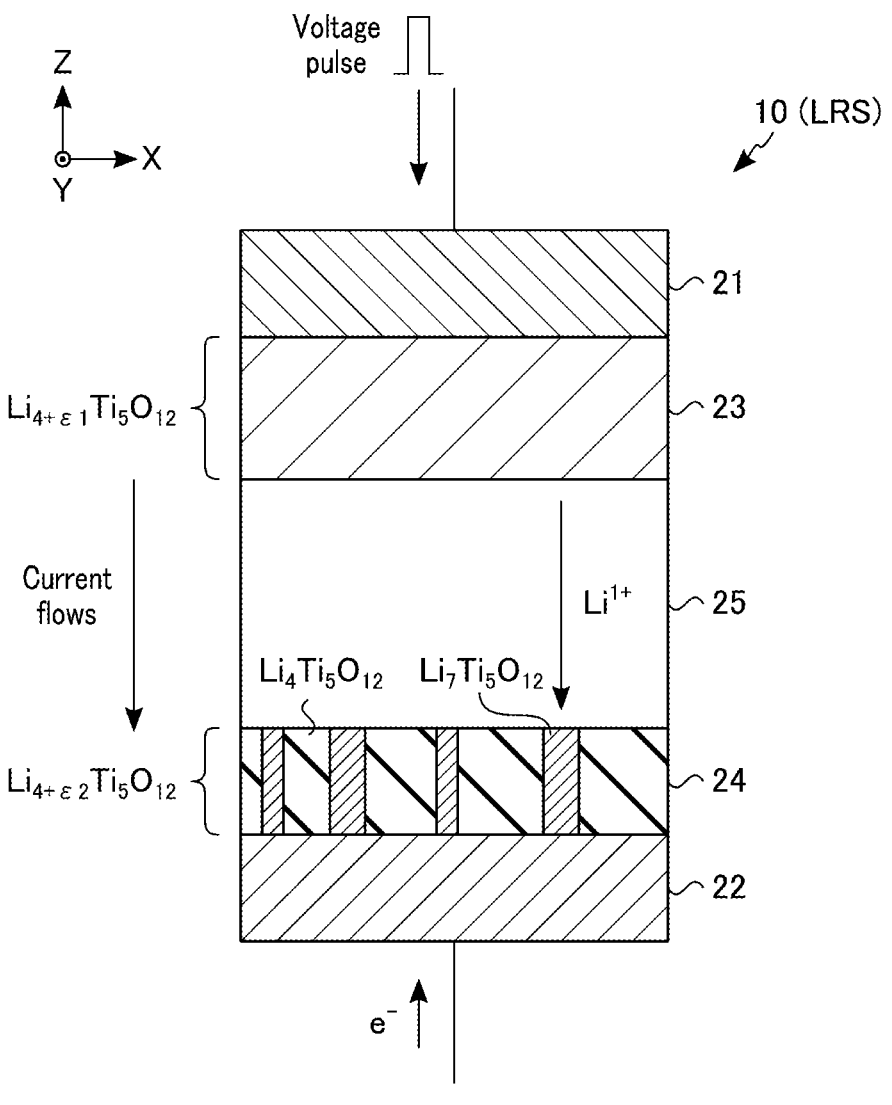
FIG. 2 is a diagram illustrating an example in a case where a resistance change element according to the first embodiment is in a low resistive state.

In general, according to one embodiment, a resistance change element includes a first electrode, a second electrode, a first transition metal compound layer provided between the first electrode and the second electrode and including lithium ions in lattice site locations, a second transition metal compound layer provided between the first transition metal compound layer and the second electrode and including the lithium ions in the lattice site locations, and a lithium ion conductor layer provided between the first transition metal compound layer and the second transition metal compound layer and being a solid material allowing the lithium ions to pass therethrough and resistant to electrons.

Embodiments will be explained hereinafter with reference to drawings. In the following explanation, constituent elements having the same function and structure are denoted by common reference numerals.

1. First Embodiment

1. 1 Structure of Resistance Change Element

First, the following is an explanation of a structure of a resistance change element 10 according to a first embodiment. FIG. 1 is a diagram illustrating an example of a cross-sectional structure of the resistance change element 10 according to the first embodiment.

The resistance change element 10 is an element, an electric resistance of which changes. More specifically, the resistance change element 10 changes to a low resistive state (LRS) in which current can flow from one electrode to the other electrode, and a high resistive state (HRS) in which little current flows, as a result of move of lithium ions inside the resistance change element 10. For example, the resistance change element 10 can store data by assignment of data "0" and data "1" according to the state of the resistance change element 10. In the following explanation, the expression "write operation" means an operation of changing the state of the resistance change element 10 from the high resistive state to the low resistive state, or from the low resistive state to the high resistive state. The expression "read operation" means an operation of reading the state of the resistance change element 10. As an example, the resistance change element 10 is used as a storage element for a neuron circuit or a synapse circuit in a brain type neural network.

As illustrated in FIG. 1, the resistance change element 10 includes a first electrode 21, a second electrode 22, a first transition metal compound layer 23, a second transition metal compound layer 24, and a lithium ion conductor layer 25. The resistance change element 10 has a stacked structure in which the first electrode 21, the first transition metal compound layer 23, the lithium ion conductor layer 25, the second transition metal compound layer 24, and the second electrode 22 are stacked in this order from the first electrode 21 side. The resistance change element 10 may further include a layer (not illustrated) between the first electrode 21 and the second electrode 22. In the following explanation, a direction extending along bonding surfaces of the layers is defined as "X direction". A direction crossing the X direction and extending along the bonding surfaces is defined as "Y direction". A direction crossing the X direction and the Y direction and perpendicular to the bonding surfaces is defined as "Z direction". The Z direction may also be referred to as "stacking direction" in which the layers are stacked.

In the resistance change element 10, lithium ions are movable between the first transition metal compound layer 23 and the second transition metal compound layer 24 via the lithium ion conductor layer 25. The moving direction of the lithium ions is the stacking direction (that is, the Z direction) in which the first electrode 21, the first transition metal compound layer 23, the lithium ion conductor layer 25, the second transition metal compound layer 24, and the second electrode 22 are stacked.

For example, bonding surfaces of the layers of the first electrode 21, the first transition metal compound layer 23, the lithium ion conductor layer 25, the second transition metal compound layer 24, and the second electrode 22 have substantially the same shape and size. More specifically, for example, a bonding surface between the first electrode 21 and the first transition metal compound layer 23, a bonding surface between the first transition metal compound layer 23 and the lithium ion conductor layer 25, a bonding surface between the lithium ion conductor layer 25 and the second transition metal compound layer 24, and a bonding surface between the second transition metal compound layer 24 and the second electrode 22 have substantially the same shape and size. In the case of using the expression "substantially the same", it may include an error caused by manufacturing variations.

A film thickness of the first transition metal compound layer 23 in the Z direction (stacking direction) is referred to as film thickness T1, and a film thickness of the second transition metal compound layer 24 in the Z direction (stacking direction) is referred to as film thickness T2. For example, in the present embodiment, the film thickness T2 of the second transition metal compound layer 24 is smaller than the film thickness T1 of the first transition metal compound layer 23 (T1>T2). The film thickness T2 of the second transition metal compound layer 24 may be equal to, or larger than, the film thickness T1 of the first transition metal compound layer 23. Specifically, the film thicknesses T1 and T2 may have a relation "T1≤T2".

The first electrode 21 and the second electrode 22 are coupled to, for example, an external circuit (not illustrated). A voltage is applied between the first electrode 21 and the second electrode 22 from the external circuit. The first electrode 21 and the second electrode 22 include conductive material. The first electrode 21 and the second electrode 22 may have the same structure or different structures.

The first transition metal compound layer 23 is coupled to the first electrode 21 (is in contact with the first electrode 21). The second transition metal compound layer 24 is coupled to the second electrode 22 (is in contact with the second electrode 22).

Each of the first transition metal compound layer 23 and the second transition metal compound layer 24 is a metal compound including lithium ions ($Li^{1+}$) in lattice site locations. For example, by observation using an atomic force microscopy (AFM), it can be verified that lithium ions are arranged in lattice site locations. The lithium ions included in the first transition metal compound layer 23 and the second transition metal compound layer 24 move between the first transition metal compound layer 23 and the second transition metal compound layer 24 by application of voltage between the first electrode 21 and the second electrode 22. Electrons are movable in each of the first transition metal compound layer 23 and the second transition metal compound layer 24, by application of voltage between the first electrode 21 and the second electrode 22. In this case, electrons can move between the first electrode 21 and the first transition metal compound layer 23. Electrons can move between the second electrode 22 and the second transition metal compound layer 24.

Each of the first transition metal compound layer 23 and the second transition metal compound layer 24 may be, for example, a metal oxide including lithium ions in lattice site locations. Hereinafter, the present embodiment illustrates the case where each of the first transition metal compound layer 23 and the second transition metal compound layer 24 is an oxide including lithium and titanium. The first transition metal compound layer 23 is expressed as "$Li_{4+\varepsilon1}Ti_5O_{12}$". The second transition metal compound layer 24 is expressed as "$Li_{4+\varepsilon2}Ti_5O_{12}$". Herein, variables ε1 and ε2 have the relation "$0 \leq \varepsilon2 < \varepsilon1 \leq 3$". The composition "4+ε1" represents composition (concentration) of lithium ions in the first transition metal compound layer 23. The composition "4+ε2" represents composition of lithium ions in the second transition metal compound layer 24. Each of $Li_{4+ε1}Ti_5O_{12}$ and $Li_{4+ε2}Ti_5O_{12}$ is not solid solution, but a mixture of $Li_4Ti_5O_{12}$ and $Li_7Ti_5O_{12}$. For example, $Li_4Ti_5O_{12}$ and $Li_7Ti_5O_{12}$ can be identified by analysis, such as X-ray diffraction (XRD).

$Li_4Ti_5O_{12}$ is a spinel type transition metal oxide, and has characteristics of an insulator. $Li_7Ti_5O_{12}$ is a rock salt type transition metal oxide, and has metallic conductivity. In each of the spinel type transition metal oxide $Li_4Ti_5O_{12}$ and the rock salt type transition metal oxide $Li_7Ti_5O_{12}$, lithium ions are arranged in lattice site locations. The composition 4+ε1 and the composition 4+ε2 change according to the ratio (volume ratio) of $Li_4Ti_5O_{12}$ to $Li_7Ti_5O_{12}$ existing in each of the first transition metal compound layer 23 and the second transition metal compound layer 24. For example, as the ratio of $Li_7Ti_5O_{12}$ in the first transition metal compound layer 23 increases, the composition 4+ε1 increases. In the same manner, as the ratio of $Li_7Ti_5O_{12}$ in the second transition metal compound layer 24 increases, the composition 4+ε2 increases. The first transition metal compound layer 23 and the second transition metal compound layer 24 are different in composition of the lithium ions arranged in the lattice site locations. The variables ε1 and ε2 have the relation "ε2<ε1". Specifically, the composition 4+ε1 and the composition 4+ε2 have the relation "4+ε2<4+ε1". Accordingly, the first transition metal compound layer 23 has a higher ratio of $Li_7Ti_5O_{12}$ than that of the second transition metal compound layer 24. In other words, the first transition metal compound layer 23 has a larger composition of lithium ions arranged in the lattice site locations than that of the second transition metal compound layer 24.

For example, the composition 4+ε1 of the first transition metal compound layer 23 is 7 at most. Specifically, there are cases where "ε1=3" is satisfied. In other words, the first transition metal compound layer 23 can be in a state of including $Li_7Ti_5O_{12}$ and not including $Li_4Ti_5O_{12}$. The minimum value of the composition 4+ε2 of the second transition metal compound layer 24 is 4. Specifically, there are cases where "ε2=0" is satisfied. In other words, the second transition metal compound layer 24 can be in a state of including $Li_4Ti_5O_{12}$ and not including $Li_7Ti_5O_{12}$.

The first transition metal compound layer 23 may be formed of the same base material as that of the second transition metal compound layer 24 as described above, but may be one of $LiTi_2O_4$, $Li_4Ti_5O_{12}$, $Li[CrTi]O_4$, $(Li_{1/2}Fe_{1/2})$ $[Li_{1/2}Fe_{1/2}Ti]O_4$, and $Li_{1/2}Mn_2O_4$ being a spinel type transition metal oxide including lithium ions in lattice site locations, or a mixture thereof. The first transition metal compound layer 23 may be one of $LiTiO_2$, $Li_7Ti_5O_{12}$, $Li_2[CrTi]O_4$, and $(Li_{3/2}Fe_{1/2})$ $[Li_{1/2}Fe_{1/2}Ti]O_4$ being a rock salt type transition metal oxide including lithium ions in lattice site locations. In addition, the first transition metal compound layer 23 may be a mixture of the spinel type transition metal oxide and the rock salt type transition metal oxide described above.

The second transition metal compound layer 24 is a mixture of a spinel type transition metal oxide and a rock salt type transition metal oxide including lithium ions in lattice site locations, but may be a mixture of oxides having different crystal structures, such as a spinel type transition metal oxide $Li_{0.5}MnO_2$ and a λ type cubic metal oxide λMnO₂.

The lithium ion conductor layer 25 is formed between the first transition metal compound layer 23 and the second transition metal compound layer 24. For example, two surfaces of the lithium ion conductor layer 25 facing the Z direction (stacking direction) are in contact with the first transition metal compound layer 23 and the second transition metal compound layer 24, respectively. The lithium ion conductor layer 25 is a solid material allowing lithium ions to pass therethrough and resistant to electrons. In other words, the lithium ion conductor layer 25 is a solid material that hardly allows electrons to pass therethrough, in comparison with easiness of passage of lithium ions. Specifically, the lithium ion conductor layer 25 is a solid material through which electrons are hard to pass than lithium ions are. For example, the lithium ion conductor layer 25 can be formed of LiPON. The lithium ion conductor layer 25 is not limited to LiPON but may be any other material, as long as it has the characteristics described above. The lithium ion conductor layer 25 is also referred to as "solid electrolyte".

1. 2 States of Resistance Change Element

The following is an explanation of states of the resistance change element 10. First, the resistance change element 10 in the low resistive state (LRS) will now be explained. FIG. 2 is a diagram illustrating an example of the case where the resistance change element 10 is in the low resistive state.

As illustrated in FIG. 2, if the resistance change element 10 is in the low resistive state, the second transition metal compound layer 24 includes lithium ions of the predetermined amount or more. The state of the resistance change element 10 changes on the basis of the composition of the lithium ions in the second transition metal compound layer 24. If the resistance change element 10 is in the low resistive state, the second transition metal compound layer 24 is a mixture of the spinel type transition metal oxide $Li_4Ti_5O_{12}$ being an insulator and the rock salt type transition metal oxide $Li_7Ti_5O_{12}$ exhibiting metal conduction. For example, in the second transition metal compound layer 24 in the low resistive state, one or more filaments $Li_7Ti_5O_{12}$ is formed, with one end is in contact with the lithium ion conductor layer 25 and the other end is in contact with the second electrode 22.

The second transition metal compound layer 24 in the low resistive state includes lithium ions being plus ions of the predetermined amount or more. In addition, filaments of $Li_7Ti_5O_{12}$ are in contact with the second electrode 22. In this state, a voltage having higher voltage on the first electrode 21 side than that on the second electrode 22 side. is applied to the resistance change element 10 For example, a positive voltage pulse is applied to the first voltage 21, as the voltage having higher voltage on the first electrode 21 side than voltage on the second electrode 22 side. As a result, lithium ions move from the first transition metal compound layer 23 to the second transition metal compound layer 24. Electrons are supplied to the second electrode 22 from the external circuit. The electrons supplied from the second electrode 22 are taken into the second transition metal compound layer 24 via the filaments of $Li_7Ti_5O_{12}$. Accordingly, if a voltage having higher voltage on the first electrode 21 side than that on the second electrode 22 side is applied to the resistance change element 10 in the low resistive state (for example, if the positive voltage pulse is applied to the first electrode 21), the resistance change element 10 can cause current to flow in a direction going from the first electrode 21 to the second electrode 22.

As described above, the resistance change element 10 is in the low resistive state in a state in which the second transition metal compound layer 24 includes lithium ions of the predetermined amount or more.

The resistance value of the resistance change element 10 in the low resistive state is determined by a combined resistance value of the first transition metal compound layer 23, the second transition metal compound layer 24, and the lithium ion conductor layer 25. In many cases, the resistance value of the second transition metal compound layer 24 is sufficiently larger than the resistance values of the first transition metal compound layer 23 and the lithium ion conductor layer 25. Accordingly, effectively, the resistance value of the resistance change element 10 in the low resistive state is determined on the basis of the resistance value of the second transition metal compound layer 24.

For example, the resistance value of the second transition metal compound layer 24 depends on the volume ratio of the spinel type transition metal oxide $Li_7Ti_5O_{12}$ being an insulator and the rock salt type transition metal oxide $Li_7Ti_5O_{12}$ exhibiting metal conduction. For this reason, the resistance value of the resistance change element 10 in the low resistive state changes linearly with respect to the composition of the lithium ions of the second transition metal compound layer 24.

The following is an explanation of the resistance change element 10 in the high resistive state (HRS). FIG. 3 is a diagram illustrating an example in the case where the resistance change element 10 is in the high resistive state.

As illustrated in FIG. 3, if the resistance change element 10 is in the high resistive state, the second transition metal compound layer 24 includes lithium ions of an amount smaller than the predetermined amount. For example, in this case, the variable ε2 of the second transition metal compound layer 24 is almost zero. Most of the structure of the second transition metal compound layer 24 is occupied by the spinel type transition metal oxide $Li_4Ti_5O_{12}$ being an insulator, and the second transition metal compound layer 24 includes little rock salt type transition metal oxide $Li_7Ti_5O_{12}$ exhibiting metal conduction. In this state, if a voltage having higher voltage on the first electrode 21 side than that on the second electrode 22 side is applied to the resistance change element 10 (for example, if the positive voltage pulse is applied to the first electrode 21), the second electrode 22 is provided with an electric field to move electrons in a direction going toward the second transition metal compound layer 24. However, because the second transition metal compound layer 24 is an insulating layer, electrons supplied from the second electrode 22 side are not taken into the second transition metal compound layer 24. Accordingly, if the resistance change element 10 is in the high resistive state, the resistance change element 10 cannot cause current to flow in the direction going from the first electrode 21 to the second electrode 22, even if it is provided with a voltage having higher voltage on the first electrode 21 side than that on the second electrode 22 side.

As described above, the resistance change element 10 is in the high resistive state in which no current flows in a direction going from the first electrode 21 to the second electrode 22, in a state in which the amount of lithium ions included in the second transition metal compound layer 24 is smaller than the predetermined amount.

The resistance value of the resistance change element 10 in the high resistive state is substantially determined on the basis of the resistance value of the second transition metal compound layer 24. It is desirable that the resistance value of the resistance change element 10 in the high resistive state is higher such that it has a larger difference from the resistance value in the low resistive state.

For example, if the film thickness T2 of the second transition metal compound layer 24 is thinner than the film thickness T1 of the first transition metal compound layer 23, the resistance change element 10 can set, in the high resistive state, the amount of lithium ions included in the second transition metal compound layer 24 to a fixed value or less, and a high resistance value can be stably achieved. Furthermore, the resistance change element 10 with such a structure can reduce the amount of lithium ions included in the second transition metal compound layer 24 to a relatively small amount. For this reason, if the resistance change element 10 is changed from the low resistive state to the high resistive state, it is possible to move the lithium ions from the second transition metal compound layer 24 to the first transition metal compound layer 23 for a relatively short time. Accordingly, the resistance change element 10 with such a structure is preferable in that the speed of the write operation can be increased. Because the resistance change element 10 with such a structure can include relatively many lithium ions in the first transition metal compound layer 23 in the low resistive state, it is possible to increase the amount of the current that can be caused to flow by the resistance change element 10. Accordingly, if the resistance change element 10 with such a structure is used as, for example, a storage element for a neuron circuit or a synapse circuit in a brain type neural network, it is possible to cause a relatively large amount of current to flow, at high speed, into the neuron circuit or the synapse circuit from the resistance change element 10 in the low resistive state. This structure is preferable in that the operation speed of the resistance change element 10 can be increased because it suffices that a small amount of lithium ions is moved under a large current amount. The resistance change element 10 with such a structure (T1>T2) is preferable in that the operation delay of the neuron circuit or the synapse circuit can be suppressed. In other words, the resistance change element 10 with such a structure (T1>T2) is preferable in that the processing capability of the neuron circuit or the synapse circuit can be improved.

The film thickness T2 of the second transition metal compound layer 24 may be the same as the film thickness T1 of the first transition metal compound layer 23, or larger than the film thickness T1 of the first transition metal compound layer 23. The second transition metal compound layer 24 can achieve higher resistance value in the high resistive state, as the film thickness thereof increases in the moving direction of the lithium ions. This structure increases a difference between resistance value of the high resistive state and the resistance value in the low resistive state of the resistance change element 10. Accordingly, if the resistance change element 10 with such a structure is used as, for example, a storage element for a neuron circuit or a synapse circuit in a brain type neural network, it is possible to shut off, with higher accuracy, leakage current from the resistance change element 10 in the high resistive state to the neuron circuit or the synapse circuit. For this reason, the resistance change element 10 with such a structure (T1≤T2) is preferable in that a malfunction of the neuron circuit or the synapse circuit can be suppressed.

The lithium ion concentration in each of the first transition metal compound layer 23 and the second transition metal compound layer 24 changes each time the resistance of the resistance change element 10 changes. For this reason, each of the layers repeats expansion and contraction each time the resistance changes. This reduces the life of the resistance change element 10. In the present embodiment, materials with small expansion and contraction are selected as the first transition metal compound layer 23 and the second transition metal compound layer 24, and the film thicknesses of the respective layers are set small. This structure achieves the resistance change element 10 resistant to expansion and contraction and with high performance. For example, the thickness of each of the first transition metal compound layer 23 and the second transition metal compound layer can be set to 100 nm or less.

The conductivity of the lithium ion conductor layer 25 is approximately $10^{-2}$ Scm$^{-1}$. If the film thickness of the lithium ion conductor layer 25 is increased, the resistance value of the resistance change element 10 in the low resistive state is determined on the basis of the resistance value of the lithium ion conductor layer 25. For this reason, to use the resistance value of the second transition metal compound layer 24 to the low resistive state, the film thickness of the lithium ion conductor layer 25 is desirably set to a thickness as thin as possible. For example, in the present embodiment, the film thickness of the lithium ion conductor layer 25 can be set to 100 nm or less.

1. 3 Relation Between Composition of Lithium Ions and Electromotive Force

The following is an explanation of relation between the composition of lithium ions and the electromotive force. FIG. 4 is a diagram illustrating electromotive force against metal lithium in discharge of a transition metal compound $Li_{4+\varepsilon}Ti_5O_{12}$ ($0<\varepsilon<3$).

As illustrated in FIG. 4, $Li_{4+\varepsilon}Ti_5O_{12}$ has constant electromotive force for metal lithium at $0<\varepsilon<3$. For this reason, if the resistance change element 10 is in the low resistive state, no electromotive force is generated between the first electrode 21 and the second electrode 22, regardless of the difference between the compositions of lithium ions included in the first transition metal compound layer 23 and the second transition metal compound layer 24.

1. 4 Write Operation

The following is an explanation of a write operation of the resistance change element 10.

First, the following is an explanation of the case of changing the resistance change element 10 from the high resistive state to the low resistive state in the write operation. FIG. 5 to FIG. 7 are diagrams each illustrating a state change of the second transition metal compound layer 24 in the case where a set pulse is applied to the resistance change element 10.

In the following explanation, the expression "set pulse" indicates a voltage pulse applied to the resistance change element 10 to change the resistance change element 10 from the high resistive state to the low resistive state. The expression "reset pulse" indicates a voltage pulse applied to the resistance change element 10 to change the resistance change element 10 from the low resistive state to the high resistive state. In the write operation, either of the set pulse and the reset pulse is applied to the resistance change element 10.

If the resistance change element 10 is changed from the high resistive state to the low resistive state, the control circuit controlling the resistance change element 10 applies the set pulse of the positive voltage higher than the voltage of the second electrode 22 to the first electrode 21. Applying the set pulse of the positive voltage higher than the voltage of the second electrode 22 to the first electrode 21 is equal to applying the set pulse of a negative voltage lower than the voltage of the first electrode 21 to the second electrode 22.

Although detailed researches have not been made with respect to a growth process of a rock salt type transition metal oxide $Li_7Ti_5O_{12}$ exhibiting metal conductivity and formed in the spinel type transition metal oxide $Li_4Ti_5O_{12}$ serving as an insulator, the rock salt type transition metal oxide $Li_7Ti_5O_{12}$ is supposed to grow in a phase separation manner under the external electric field.

As illustrated in state (a) in FIG. 5, first, the set pulse is applied to the resistance change element 10 to set the voltage of the first electrode 21 to $V+\Delta V$ and the voltage of the second electrode 22 to V. Specifically, a voltage having higher voltage on the first electrode 21 side than that on the second electrode 22 is applied to the resistance change element 10. As a result, a filament of $Li_7Ti_5O_{12}$ enters (grows) $Li_4Ti_5O_{12}$ of the second transition metal compound layer 24 from the lithium ion conductor layer 25 side along an electric force line. The entrance place is a portion depending on the fine structure of the second transition metal compound layer 24 and having a relatively strong electric field.

As illustrated in state (b) of FIG. 5, growth of the filament of $Li_7Ti_5O_{12}$ stops when the filament reaches the second electrode 22. The filament of $Li_7Ti_5O_{12}$ is saturated with lithium ions. For this reason, no more lithium ions flow into the filament of $Li_7Ti_5O_{12}$. This means that an effective high resistance interface is generated between the lithium ion conductor layer 25 and the filament of $Li_7Ti_5O_{12}$.

As illustrated in state (c) of FIG. 6, a high electric field region is generated in an interface region of the high resistance interface.

As illustrated in state (d) of FIG. 6, growth of a new filament of $Li_7Ti_5O_{12}$ starts in the high electric field region, that is, in a portion with a strong electric field.

As illustrated in state (e) of FIG. 7, the region of $Li_7Ti_5O_{12}$ increases, and conductivity of the resistance change element 10 increases. The conductivity of the resistance change element 10 is determined on the basis of the ratio of the spinel type transition metal oxide $Li_4Ti_5O_{12}$ serving as the insulator in the second transition metal compound layer 24 to the rock salt type transition metal oxide $Li_7Ti_5O_{12}$ exhibiting metal conduction. For this reason, the conductivity of the resistance change element 10 linearly depends on the composition of lithium ions in the second transition metal compound layer 24.

A plurality of entrance places may exist for filaments of $Li_7Ti_5O_{12}$. For this reason, growth of the filament of $Li_7Ti_5O_{12}$ explained using the state (a) to the state (e) of FIG. 5 to FIG. 7 may occur in a plurality of places in the second transition metal compound layer 24.

The following is an explanation of the case where the resistance change element 10 is changed from the low resistive state to the high resistive state in the write operation. If the resistance change element 10 is changed from the low resistive state to the high resistive state, the control circuit controlling the resistance change element 10 applies the reset pulse of the negative voltage lower than the voltage of the second electrode 22 to the first electrode 21. Applying the reset pulse of the negative voltage lower than the voltage of the second electrode 22 to the first electrode 21 is equal to applying the reset pulse of the positive voltage higher than the voltage of the first electrode 21 to the second electrode 22.

The lithium ions included in the second transition metal compound layer 24 passes through the lithium ion conductor layer 25 with the electric field formed by the reset pulse, and moves to the first transition metal compound layer 23. As a result, the second transition metal compound layer 24 changes from a state of including lithium ions to a state of including no lithium ions. Specifically, the second transition metal compound layer 24 changes to a state of including no rock salt type transition metal oxide $Li_7Ti_5O_{12}$. For this reason, the second transition metal compound layer 24 changes to a state in which it cannot take in electrons from the second electrode 22. As a result, the second transition metal compound layer 24 changes from a conductor to an insulator. As a result, the resistance change element 10 changes to the high resistive state.

Figure 8:
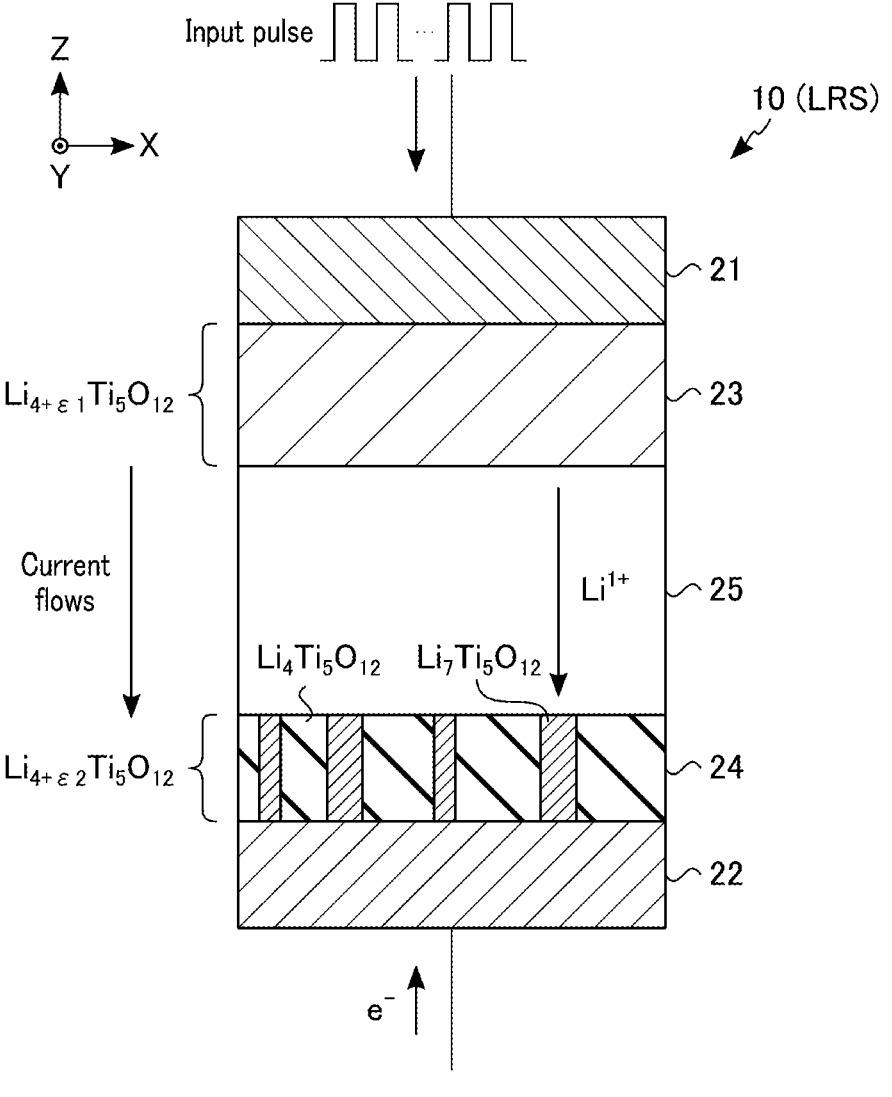
FIG. 8 is a diagram illustrating a state of the resistance change element to which an input pulse has been applied in the case where the resistance change element according to the first embodiment is in the low resistive state.

1. 5 Specific Example of Input Operation of Input Pulse to Resistance Change Element The following is an explanation of an input pulse to the resistance change element 10. FIG. 8 is a diagram illustrating a state of the resistance change element 10 to which an input pulse has been applied in the case where the resistance change element 10 is in the low resistive state.

In the following explanation, the expression "input pulse" indicates a voltage pulse applied to the resistance change element 10 if data is read from the resistance change element 10 or if the resistance change element 10 is used as a resistance element. For example, a voltage of the input pulse is lower than that of the set pulse.

A circuit (storage device) in which the resistance change element 10 is integrated applies an input pulse of the positive voltage higher than the voltage of the second electrode 22 to the first electrode 21, if data is read from the resistance change element 10 or if the resistance change element 10 is used as a resistance element. Applying the input pulse of the positive voltage higher than the voltage of the second electrode 22 to the first electrode 21 is equal to applying the input pulse of the negative voltage lower than the voltage of the first electrode 21 to the second electrode 22.

The lithium ions included in the first transition metal compound layer 23 passes through the lithium ion conductor layer 25 with the electric field formed by the input pulse, and moves to the second transition metal compound layer 24. When the lithium ions reach, the second transition metal compound layer 24 takes in electrons from the second electrode 22. As a result, the resistance change element 10 in the low resistive state can cause current to flow therethrough if the input pulse is applied.

The electric charge of the lithium ions included in the first transition metal compound layer 23 has an upper limit. Specifically, the amount of lithium ions movable from the first transition metal compound layer 23 to the second transition metal compound layer 24 has an upper limit. For example, the electric charge of lithium ions included in $Li_7Ti_5O_{12}$ with a size of $100\times100\times100$ nm$^3$ is approximately $1.5\times10^{-11}$ coulomb. In this case, a current pulse of 1 nA with a pulse time width of 1 μsecond can be caused to flow through the resistance change element 10 including the first transition metal compound layer 23 using $Li_7Ti_5O_{12}$ of such a size as the base material, by $1.5\times10^4$ times or around as an upper limit. The control circuit controlling the resistance change element 10 may execute control to read the state of the resistance change element 10, within the upper limit of the current (the number of times of the current pulse) that can be caused to flow through the resistance change element 10.

In contrast, if the resistance change element 10 is in the high resistive state, the second transition metal compound layer 24 does not include lithium ions of sufficient amount in the lattice site locations, and cannot take in electrons from the second electrode 22, even if lithium ions reach with the electric field formed by the input pulse. As a result, the resistance change element 10 in the high resistive state cannot cause current to flow therethrough, even if the input pulse is applied thereto.

1. 6 Effects of Present Embodiment

With the structure according to the present embodiment, the resistance change element 10 can achieve the low resistive state and the high resistive state by changing the compositions of the lithium ions included in the lattice site locations of the first transition metal compound layer 23 and the second transition metal compound layer 24. This structure improves the repetition characteristics and the linearity of the resistance change element.

For example, a conventional thin-film battery type resistance change element using lithium ions achieves a low resistive state and a high resistive state by changing the composition of lithium ions included in interstices of a transition metal compound layer. In this case, the volume of the transition metal compound layer changes according to the composition of the lithium ions included in the interstices. For example, the volume change amount reaches several percent. The resistance change element deteriorates when expansion/contraction of the volume is repeated with change of the resistive state of the resistance change element. For this reason, no sufficient repetition characteristics can be acquired. Specifically, the life of the resistance change element is relatively short. The state of the resistance change element depends on the composition of the lithium ions in the transition metal compound layer. However, the resistance value of the resistance change element does not linearly change with respect to the composition of the lithium ions. Specifically, the conductivity of the resistance change element does not linearly change with respect to the number of pulses of the voltage pulses applied to the resistance change element.

In contrast, the resistance change element 10 according to the present embodiment includes the first electrode 21, the first transition metal compound layer 23, the lithium ion conductor layer 25, the second transition metal compound layer 24, and the second electrode 22. The first transition metal compound layer 23 and the second transition metal compound layer 24 include lithium ions in the lattice site locations. The resistance change element 10 can change the composition of the lithium ions included in the lattice site positions of the first transition metal compound layer 23 and the second transition metal compound layer 24, on the basis of the voltage applied to the resistance change element 10. As a result, the resistance change element 10 can achieve the low resistive state and the high resistive state. The resistance change element 10 changes the composition of the lithium ions in the lattice site locations. For this reason, the resistance change element 10 can suppress the volume change of the first transition metal compound layer 23 and the second transition metal compound layer 24 due to change of the state to 1% or less. The resistance change element 10 is capable of suppressing deterioration of the resistance change element 10 due to volume change, and improving the repetition characteristics of the resistance change element 10. Accordingly, the life of the resistance change element 10 can be improved.

The second transition metal compound layer 24 of the resistance change element 10 according to the present embodiment includes, for example, a spinel type transition metal oxide $Li_4Ti_5O_{12}$ being an insulator and a rock salt type transition metal oxide $Li_7Ti_5O_{12}$ exhibiting metal conduction. The resistance value of the second transition metal compound layer 24 depends on the volume ratio of the spinel type transition metal oxide $Li_4Ti_5O_{12}$ to the rock salt type transition metal oxide $Li_7Ti_5O_{12}$. Accordingly, the resistance value of the resistance change element 10 in the low resistive state linearly changes with respect to the composition of the lithium ions included in the second transition metal compound layer 24. For this reason, the resistance value of the resistance change element 10 in the low resistive state can be controlled by the composition of the second transition metal compound layer 24. Accordingly, the conductivity of the resistance change element 10 can be changes linearly with respect to the number of voltage pulses applied to the resistance change element 10, that is, the linearity of the resistance change element 10 can be improved.

2. Second Embodiment

The following is an explanation of a storage device 30 according to a second embodiment. The storage device 30 according to the second embodiment uses the resistance change element 10 explained in the first embodiment as a storage element.

2. 1 Configuration of Storage Device

First, the following is an explanation of an example of a configuration of the storage device 30 according to the present embodiment. FIG. 9 is a diagram illustrating an example of a configuration of the storage device 30 according to the second embodiment. The example of FIG. 9 omits illustration of the first transition metal compound layer 23, the second transition metal compound layer 24, and the lithium ion conductor layer 25, to simplify the explanation.

As illustrated in FIG. 9, the storage device 30 includes a resistance change element 10, a switch circuit 31, a control circuit 32, and an output circuit 33.

The switch circuit 31 is a circuit to short-circuit or open between a second electrode 22 of the resistance change element 10 and the ground. One end of a transmission path of the switch circuit 31 is coupled to the second electrode 22 of the resistance change element 10 and the output circuit 33, and the other end of the transmission path is coupled to the ground (grounded). The switch circuit 31 receives a switching signal from the control circuit 32. The switching signal is a signal to switch the switch circuit 31 to a short-circuit state (ON state) or an open state (OFF state). The switch circuit 31 is controlled to a short-circuit state or an open state on the basis of the switching signal. For example, the switch circuit 31 is changed to the short-circuit state in the write operation, and to the open state in a read operation. The switch circuit 31 is achieved with, for example, a metal-oxide-semiconductor field effect transistor (MOSFET).

The control circuit 32 controls the write operation and the read operation in the resistance change element 10. The control circuit 32 is coupled to, for example, a first electrode 21 of the resistance change element 10 and the switch circuit 31. The control circuit 32 is also coupled to a circuit (not illustrated) managing the state of the resistance change element 10. For example, the control circuit 32 receives a state setting signal from the circuit managing the state of the resistance change element 10 in the write operation. The state setting signal is a signal to instruct the resistance change element 10 to change to the high resistive state or the low resistive state. The control circuit 32 applies the set pulse or the reset pulse to the first electrode 21 on the basis of the state setting signal.

In the write operation, the control circuit 32 changes the switch circuit 31 to the short-circuit state. The second electrode 22 of the resistance change element 10 is coupled to the ground. As a result, the resistance change element 10 is changed to a state in which the set pulse or the reset pulse can be applied to the resistance change element 10. Thereafter, the control circuit 32 applies the set pulse or the reset pulse to the first electrode 21 on the basis of the state setting signal. As a result, the resistance change element 10 is changed to the low resistive state or the high resistive state.

More specifically, in the write operation, for example, if the control circuit 32 receives the state setting signal corresponding to the low resistive state, the control circuit 32 applies the set pulse to the resistance change element 10. Specifically, the control circuit 32 applies the positive voltage higher than the voltage of the second electrode 22 to the first electrode 21 to move lithium ions included in the first transition metal compound layer 23 to the second transition metal compound layer 24. As a result, the resistance change element 10 is changed to the low resistive state.

In the write operation, for example, if the control circuit 32 receives the state setting signal corresponding to the high resistive state, the control circuit 32 applies the reset pulse to the resistance change element 10. Specifically, the control circuit 32 applies the negative voltage lower than the voltage of the second electrode 22 to the first electrode 21 to move lithium ions included in the second transition metal compound layer 24 to the first transition metal compound layer 23. As a result, the resistance change element 10 is changed to the high resistive state.

In the read operation, the control circuit 32 changes the switch circuit 31 to the open state. The second electrode 22 of the resistance change element 10 is released from the ground. As a result, the resistance change element 10 is changed to a state in which the resistance change element 10 can be read by an external circuit (not illustrated).

In this state, for example, the input pulse is applied from the external circuit to the first electrode 21 of the resistance change element 10. More specifically, for example, the external circuit applies the input pulse having a voltage higher than the voltage of the second electrode 22 to the first electrode 21 of the resistance change element 10. The storage device 30 may further include a pulse generation circuit generating the input pulse if a read instruction is received from an external circuit. For example, the pulse generation circuit is coupled to the first electrode 21.

The output circuit 33 outputs an output signal indicating whether current flows through the resistance change element 10, at timing of application of the input pulse to the resistance change element 10. The output circuit 33 is coupled to the second electrode 22 of the resistance change element 10 and the switch circuit 31. For example, the output circuit 33 includes a capacitor 41. One electrode of the capacitor 41 is coupled to the second electrode 22 of the resistance change element 10, and the other electrode thereof is coupled to the ground. The output circuit 33 outputs a voltage at a coupling point between the capacitor 41 and the second electrode 22 of the resistance change element 10, as the output signal. For example, data can be read out by comparing the voltage of the output signal with a predetermined value (reference voltage).

In the read operation, current flows through the resistance change element 10, if the input pulse is applied to the resistance change element 10 in the low resistive state. As a result, the output circuit 33 outputs the output signal of a voltage higher than the predetermined value.

In the read operation, no current flow through the resistance change element 10, if the input pulse is applied to the resistance change element 10 in the high resistive state. As a result, the output circuit 33 outputs the output signal of a voltage equal to or lower than the predetermined value.

2. 2 Effects of Present Embodiment

The structure according to the present embodiment produces the same effects as those of the first embodiment.

Furthermore, the storage device 30 according to the present embodiment includes the resistance change element 10, the switch circuit 31, the control circuit 32, and the output circuit 33. The control circuit 32 can change the resistance change element 10 to the low resistive state if it receives an instruction (state setting signal corresponding to the low resistive state) to change the resistance change element 10 to the low resistive state, in the write operation. The control circuit 32 can also change the resistance change element 10 to the high resistive state if it receives an instruction (state setting signal corresponding to the high resistive state) to change the resistance change element 10 to the high resistive state, in the write operation.

Furthermore, in the storage device 30 according to the present embodiment, in the read operation, the input pulse is applied to the resistance change element 10. In this operation, if the resistance change element 10 is in the low resistive state, the output circuit 33 can output the output signal of a voltage higher than the predetermined value. If the resistance change element 10 is in the high resistive state, the output circuit 33 can output the output signal of a voltage equal to or lower than the predetermined value. The state of the resistance change element 10 can be determined on the basis of the voltage of the output signal. Specifically, data can be read out from the resistance change element 10.

The storage device 30 according to the present embodiment can change the state of the resistance change element 10 in accordance with an instruction from the external circuit, and output the state of the resistance change element 10 to the external circuit. Accordingly, the storage circuit 30 can function as a storage device storing binary information.

3. Third Embodiment

The following is an explanation of a storage device 30 according to a third embodiment. In the third embodiment, structure of the storage device 30 different from that of the second embodiment is explained. The following explanation mainly illustrates points different from those of the second embodiment.

3. 1 Structure of Storage Device

First, the following is an explanation of an example of a structure of the storage device 30 according to the present embodiment. FIG. 10 is a diagram illustrating an example of the structure of the storage device 30 according to the third embodiment. The example of FIG. 10 omits illustration of the first transition metal compound layer 23, the second transition metal compound layer 24, and the lithium ion conductor layer 25, to simplify the explanation.

As illustrated in FIG. 10, the storage device 30 includes a resistance change element 10, a switch circuit 31, a control circuit 32, an output circuit 33, and a positive/negative inversion circuit 51.

The positive/negative inversion circuit 51 is a circuit switching coupling between the resistance change element 10, the external circuit, the switch circuit 31, and the control circuit 32 on the basis of a control signal received from the control circuit 32. Specifically, the positive/negative inversion circuit 51 switches the coupling relation of the first electrode 21 and the second electrode 22 to other circuits.

The positive/negative inversion circuit 51 includes terminals TN1 to TN6. The terminal TN1 is coupled to the external circuit and an output terminal of the control circuit 32 for the set pulse and the reset pulse. The terminal TN1 is also configured to be capable of being coupled one of the terminal TN2 and the terminal TN3. The terminal TN2 is coupled to the terminal TN6 and the first electrode 21 of the resistance change element 10. The terminal TN3 is coupled to the terminal TN5. The terminal TN4 is coupled to the switch circuit 31 and the output circuit 33. The terminal TN4 is configured to be capable of being coupled to one of the terminal TN5 and the terminal TN6. The terminal TN5 is coupled to the terminal TN3 and the second electrode 22 of the resistance change element 10.

The positive/negative inversion circuit 51 is set to one of a combination coupling the terminal TN1 to the terminal TN2 and coupling the terminal TN4 to the terminal TN5 and a combination coupling the terminal TN1 to the terminal TN3 and coupling the terminal TN4 to the terminal TN6. For example, if the positive/negative inversion circuit 51 is set to the combination coupling the terminal TN1 to the terminal TN2 and coupling the terminal TN4 to the terminal TN5, it is possible to apply one of the input pulse, the set pulse, and the reset pulse to the first electrode 21. In addition, the second electrode 22 is coupled to the switch circuit 31 and the output circuit 33. On the other hand, if positive/negative inversion circuit 51 is set to the combination coupling the terminal TN1 to the terminal TN3 and coupling the terminal TN4 to the terminal TN6, it is possible to apply one of the input pulse, the set pulse, and the reset pulse to the second electrode 22. In addition, the first electrode 21 is coupled to the switch circuit 31 and the output circuit 33.

For example, in the read operation, the positive/negative inversion circuit 51 switches between application of the input pulse applied from the external circuit to the first electrode 21 as a first input pulse having a voltage higher than the voltage of the second electrode 22 and application of the input pulse to the second electrode 22 as a second input pulse having a voltage higher than the first electrode 21. As a result, in the read operation, the first input pulse and the second input pulse are alternately applied to the resistance change element 10.

The switch circuit 31 according to the present embodiment is a circuit short-circuiting or opening between the terminal TN4 of the positive/negative inversion circuit 51 and the ground. One end of a transmission path of the switch circuit 31 is coupled to the terminal TN4 of the positive/negative inversion circuit 51 and the output circuit 33, and the other end of the transmission path thereof is coupled to the ground. The other structures thereof are the same as those explained in the second embodiment.

The control circuit 32 of the present embodiment is further coupled to the positive/negative inversion circuit 51. The other couplings are the same as those explained in the second embodiment. The control circuit 32 transmits a control signal to the positive/negative inversion circuit 51. The control signal is a signal controlling coupling of the positive/negative inversion circuit 51.

In addition, in the read operation, the control circuit 32 can switch the first input pulse and the second input pulse each time the first input pulse or the second input pulse is applied a plurality of number of times. Specifically, the control circuit 32 switches coupling of the positive/negative inversion circuit 51.

For example, after change of the state of the resistance change element 10 (after write operation), the control circuit 32 switches coupling of the positive/negative inversion circuit 51 such that the first input pulse is applied to the resistance change element 10. Thereafter, in the read operation, after the first input pulse is applied to the resistance change element 10 a plurality of number of times, the control circuit 32 switches coupling of the positive/negative inversion circuit 51 such that the second input pulse is applied to the resistance change element 10. Thereafter, in the read operation, after the second input pulse is applied to the resistance change element 10 a plurality of number of times, the control circuit 32 switches coupling of the positive/negative inversion circuit 51 such that the first input pulse is applied to the resistance change element 10. The control circuit 32 repeats such switch processing in the read operation. For example, when the first input pulse is applied to the first electrode 21, lithium ions move from the first transition metal compound layer 23 to the second transition metal compound layer 24. On the other hand, when a second input pulse is applied to the second electrode 22, lithium ions move from the second transition metal compound layer 24 to the first transition metal compound layer 23. In the read operation, when the first input pulse and the second input pulse are alternately applied to the resistance change element 10, the lithium ions having moved from the first transition metal compound layer 23 to the second transition metal compound layer 24 by the first input pulse move (return) to the first transition metal compound layer 23 by the second input pulse.

The output circuit 33 outputs an output signal indicating whether current has flowed through the resistance element 10, at timing of application of the first input pulse or the second input pulse from the external circuit to the resistance change element 10. The structure of the output circuit 33 is the same as that of the second embodiment. For example, if the first input pulse is applied to the resistance change element 10, the output circuit 33 outputs the voltage of the second electrode 22 of the resistance change element 10 as the output signal. In addition, for example, if the second input pulse is applied to the resistance change element 10, the output circuit 33 outputs the voltage of the first electrode 21 of the resistance change element 10 as the output signal.

3. 2 Effects of Present Embodiment

The structure according to the present embodiment produces the same effects as those of the first and the second embodiments.

Furthermore, the storage device 30 according to the present embodiment includes the resistance change element 10, the switch circuit 31, the control circuit 32, the output circuit 33, and the positive/negative inversion circuit 51. The positive/negative inversion circuit 51 is capable of switching coupling of the resistance change element 10. The positive/negative inversion circuit 51 is capable of switching the case where the first input pulse is applied to the first electrode 21 and the case where the second input pulse is applied to the second electrode 22, in the read operation. When the first electrode 21 is applied to the first input pulse, lithium ions move from the first transition metal compound layer 23 to the second transition metal compound layer 24. When the second electrode 22 is applied to the second input pulse, lithium ions move from the second transition metal compound layer 24 to the first transition metal compound layer 23. Accordingly, in the read operation, switching coupling of the resistance element 10 enables return of the lithium ions having moved from the first transition metal compound layer 23 to the second transition metal compound layer 24 to the first transition metal compound layer 23. As a result, the storage device 30 is enabled to cause current flow through the resistance change element 10 such that the current does not exceed the upper limit of the current (upper limit of movable lithium ions) that can be caused to flow through the resistance change element 10, in the case where the resistance change element 10 is in the low resistive state. This structure enables the storage device 30 to execute the read operation of the resistance change element 10 with the external circuit without any limit to the number of times of applications of the input pulse.

4. Fourth Embodiment

The following is an explanation of a storage device 30 according to the fourth embodiment. The fourth embodiment illustrates a structure of the storage device 30 different from those of the second and the third embodiments. The storage device 30 according to the present embodiment is effective in the case where electromotive force occurs between the first transition metal compound layer 23 and the second transition metal compound layer 24 of the resistance change element 10. The following explanation mainly illustrates points different from those of the second and the third embodiments.

4. 1 Structure of Storage Device

First, the following is an explanation of an example of a structure of the storage device 30 according to the present embodiment. FIG. 11 is a diagram illustrating an example of the structure of the storage device 30 according to the fourth embodiment. The example of FIG. 11 omits illustration of the first transition metal compound layer 23, the second transition metal compound layer 24, and the lithium ion conductor layer 25, to simplify the explanation.

As illustrated in FIG. 11, the storage device 30 includes a resistance change element 10, a switch circuit 31, a control circuit 32, an output circuit 33, and a short-circuiting switch 52.

The short-circuiting switch 52 is a circuit short-circuiting or opening between the first electrode 21 and the second electrode 22 of the resistance change element 10 on the basis of a control signal received from the control circuit 32. One end of a transmission path of the short-circuiting switch 52 is coupled to the first electrode 21, and the other end of the transmission path thereof is coupled to the second electrode 22. The short-circuiting switch 52 is achieved with, for example, a MOSFET.

One end of the transmission path of the switch circuit 31 according to the present embodiment is coupled to the second electrode 22, the short-circuiting switch 52, and the output circuit 33, and the other end of the transmission path thereof is coupled to the ground. The other structures are the same as those explained in the second embodiment.

The control circuit 32 of the present embodiment is further coupled to the short-circuiting switch 52. The other couplings are the same as those explained in the second embodiment. The control circuit 32 transmits a control signal to the short-circuiting switch 52. The control signal of the present embodiment is a signal switching the short-circuiting switch 52 to a short-circuit state (ON state) or an open state (OFF state). In the read operation, the control circuit 32 short-circuits the first electrode 21 and the second electrode 22 by changing the short-circuiting switch 52 to the short-circuit state for a predetermined time each time the input pulse is applied a plurality of number of times. For example, there are cases where electromotive force is generated in the resistance change element 10 by short-circuiting between the first electrode 21 and the second electrode 22. In this case, the lithium ions having moved from the first transition metal compound layer 23 to the second transition metal compound layer 24 by the input pulse move (return) to the first transition metal compound layer 23 by the electromotive force generated in the resistance change element 10.

The output circuit 33 according to the present embodiment is coupled to the second electrode 22, the short-circuiting switch 52, and the switch circuit 31. The other structures are the same as those explained in the second embodiment.

4. 2 Effects of Present Embodiment

The structure according to the present embodiment can produce the same effects as those of the first and the second embodiment.

Furthermore, the storage device 30 according to the present embodiment includes the resistance change element 10, the switch circuit 31, the control circuit 32, the output circuit 33, and the short-circuiting switch 52. The short-circuiting switch 52 is capable of short-circuiting between the first electrode 21 and the second electrode 22 of the resistance change element 10. In the read operation, the control circuit 32 is capable of electrically coupling the first electrode 21 to the second electrode 22 by changing the short-circuiting switch 52 to the short-circuit state for a predetermined time each time the input pulse is applied a plurality of number of times. When between the first electrode 21 and the second electrode 22 is short-circuited, electromotive force is generated in the resistance change element 10. By the electromotive force, lithium ions move from the second transition metal compound layer 24 to the first transition metal compound layer 23. Accordingly, by short-circuiting between the first electrode 21 and the second electrode 22 using the short-circuiting switch 52, it is possible to return the lithium ions having moved from the first transition metal compound layer 23 to the second transition metal compound layer 24 to the first transition metal compound layer 23. As a result, the storage device 30 is enabled to cause current flow through the resistance change element 10 such that the current does not exceed the upper limit of the current (upper limit of movable lithium ions) that can be caused to flow through the resistance change element 10, in the case where the resistance change element 10 is in the low resistive state. Accordingly, this structure enables the storage device 30 to execute the read operation of the resistance change element 10 with the external circuit without any limit to the number of times of applications of the input pulse.

5. Fifth Embodiment

The following is an explanation of a storage device 30 according to the fifth embodiment. The fifth embodiment illustrates a structure of the storage device 30 different from those of the second to the fourth embodiments.

5. 1 Structure of Storage Device

First, the following is an explanation of an example of a structure of the storage device 30 according to the present embodiment. FIG. 12 is a diagram illustrating an example of the structure of the storage device 30 according to the fifth embodiment.

As illustrated in FIG. 12, the storage device 30 includes a resistance change element 10, a switch circuit 31, a control circuit 32, and an output circuit 33.

In the present embodiment, in the read operation, the resistance change element 10 is alternately and repeatedly provided with an input pulse (hereinafter referred to as "normal rotation pulse") having a voltage higher than that of the second electrode 22 and an input pulse (hereinafter referred to as "reverse rotation pulse") having a voltage lower than that of the second electrode 22, from the external circuit. Specifically, the input pulse includes the normal rotation pulse and the reverse rotation pulse. While the normal rotation pulse is applied to the resistance change element 10, lithium ions move from the first transition metal compound layer 23 to the second transition metal compound layer 24. While the reverse rotation pulse is applied to the resistance change element 10, lithium ions move from the second transition metal compound layer 24 to the first transition metal compound layer 23. Accordingly, by alternate application of the normal rotation pulse and the reverse rotation pulse, lithium ions having moved from the first transition metal compound layer 23 to the second transition metal compound layer 24 by the normal rotation pulse move (return) to the first transition metal compound layer 23 by the reverse rotation pulse. The reverse rotation pulse may be applied to the resistance change element 10 after the normal rotation pulse is applied, or the normal rotation pulse may be applied to the resistance change element 10 after the reverse rotation pulse is applied. The storage device 30 may further include a pulse generation circuit receiving a read instruction from the external circuit and successively generating the normal rotation pulse and the reverse rotation pulse in response to reception of the read instruction. For example, the pulse generation circuit is coupled to the first electrode 21.

The structures of the switch circuit 31 and the control circuit 32 are the same as those explained in the second embodiment.

The output circuit 33 of the present embodiment outputs an output signal indicating whether any current has flowed through the resistance change element 10, at timing of application of the normal rotation pulse to the resistance change element 10. The output circuit 33 outputs an output signal indicating that no current has flowed, at timing of application of the reverse rotation pulse to the resistance change element 10.

For example, the output circuit 33 includes a N-type MOSFET 60, a first resistive element 61, a second resistive element 62, a third resistive element 63, and a capacitor 41.

A gate of the N-type MOSFET 60 is coupled to the second electrode 22 of the resistance change element 10 and the switch circuit 31.

One terminal of the first resistive element 61 is coupled to the gate of the N-type MOSFET 60. The other terminal of the first resistive element 61 is coupled to the ground.

A power supply voltage Vdd is applied to one terminal of the second resistive element 62. The other terminal of the second resistive element 62 is coupled to a drain of the N-type MOSFET 60.

One terminal of the third resistive element 63 is coupled to a source of the N-type MOSFET 60. The other terminal of the third resistive element 63 is coupled to the ground.

One electrode of the capacitor 41 is coupled to the source of the N-type MOSFET 60. The other electrode of the capacitor 41 is coupled to the ground.

The output terminal 33 outputs a voltage at a connection point of the capacitor 41 and the source of the N-type MOSFET 60 as the output signal.

An output signal in the read operation will now be briefly explained. For example, while the normal rotation pulse is applied to the resistance change element 10 in the low resistive state, current flows through the resistance change element 10. During the operation, a voltage higher than a threshold voltage is applied to the gate of the N-type MOSFET 60. For this reason, the N-type MOSFET 60 is changed to an ON state, and between the drain and the source is changed to a conductive state. As a result, the output circuit 33 outputs the output signal of a power supply voltage level for a period in which the normal rotation pulse is applied to the resistance change element 10 in the low resistive state.

If the normal rotation pulse is applied to the resistance change element 10 in the high resistive state, no current flows through the resistance change element 10. Accordingly, a voltage lower than the threshold voltage is applied to the gate of the N-type MOSFET 60. For this reason, the N-type MOSFET 60 is set to an OFF state, and between the drain and the source is set to a nonconductive state. As a result, the output circuit 33 outputs the output signal of a ground level if the normal rotation pulse is applied to the resistance change element 10 in the high resistive state.

If the reverse rotation pulse is applied to the resistance change element 10, no current flows through the resistance change element 10, in the same manner as the case where the normal rotation pulse is applied to the resistance change element 10 in the high resistive state. Accordingly, a voltage lower than the threshold voltage is applied to the gate of the N-type MOSFET 60. For this reason, the N-type MOSFET 60 is set to the OFF state, and between the drain and the source is set to the nonconductive state. As a result, the output circuit 33 outputs the output signal of the ground level if the reverse rotation pulse is applied to the resistance change element 10.

5. 2 Effects of Present Embodiment

The structure according to the present embodiment can produce the same effects as those of the first and the second embodiment.

Furthermore, the storage device 30 according to the present embodiment includes the resistance change element 10, the switch circuit 31, the control circuit 32, and the output circuit 33. In the read operation, the storage device 30 can alternately apply the normal rotation pulse and the reverse rotation pulse to the resistance change element 10. When the normal rotation pulse is applied to the resistance change element 10, lithium ions move from the first transition metal compound layer 23 to the second transition metal compound layer 24. On the other hand, when the reverse rotation pulse is applied to the resistance change element 10, lithium ions move from the second transition metal compound layer 24 to the first transition metal compound layer 23. Accordingly, by alternately applying the normal rotation pulse and the reverse rotation pulse to the resistance change element 10, it is possible to return the lithium ions having moved from the first transition metal compound layer 23 to the second transition metal compound layer 24 to the first transition metal compound layer 23, the storage device 30 is enabled to cause current flow through the resistance change element 10 such that the current does not exceed the upper limit (upper limit of movable lithium ions) of the current that can be caused to flow through the resistance change element 10, in the case where the resistance change element 10 is in the low resistive state. With this structure, the storage device 30 enables read of the state of the resistance change element 10 with the external circuit without any limit to the number of times of reads.

6. Sixth Embodiment

The following is an explanation of a neural network apparatus 70 according to a sixth embodiment. The neural network apparatus 70 according to the sixth embodiment uses the storage device 30 explained in each of the second to the fifth embodiments as a storage circuit.

6. 1 Configuration of Neural Network Apparatus

First, the following is an explanation of an example of a configuration of the neural network apparatus 70. FIG. 13 is a diagram illustrating an example of a configuration of the neural network apparatus 70 according to the sixth embodiment.

As illustrated in FIG. 13, the neural network apparatus 70 includes an arithmetic circuit 71, an inference weight storage circuit 72, a learning weight storage circuit 73, and a learning control circuit 74.

The arithmetic circuit 71 executes an arithmetic operation in accordance with a neural network. The arithmetic circuit 71 is achieved with, for example, an electric circuit including an analog circuit. For example, the arithmetic circuit 71 receives M (M is an integer of 2 or more) input signals $(x_1, \ldots, x_M)$, and outputs an output signal $(z)$. The arithmetic circuit 71 may output a plurality of output signals.

The inference weight storage circuit 72 stores, for example, a plurality of inference weights used for the arithmetic operation executed by the arithmetic circuit 71 in accordance with the neural network. The inference weight storage circuit 72 includes a plurality of storage devices 30 corresponding to the respective inference weights. Specifically, the inference weight storage circuit 72 includes a plurality of resistance change elements 10 storing the respective inference weights. The inference weight storage circuit 72 stores, for example, L (L is an integer of 2 or more) inference weights $(w_{d1}, \ldots, w_{dL})$ in the storage devices 30. Each of the inference weights is an N value (N is an integer of 2 or more). In other words, each of the inference weights is a digital value. The inference weight storage circuit 72 converts the output voltage of each of the storage devices 30 into an inference weight of an N value, and transmits it to the arithmetic circuit 71. For example, if the inference weight storage circuit 72 converts an output voltage of each of the storage devices 30 into an inference weight $w_{di}$ (i is an integer of 1 or more and equal to or less than L), the inference weight storage circuit 72 converts the output voltage into one of set weights $(S_0, S_1, S_2, \ldots, S_{N-1})$ using one of preset conversion thresholds $(T_0, T_i, \ldots, T_{N-2})$. For example, the inference weight storage circuit 72 outputs an inference weight "$w_{di} = S_k$", if the voltage value $V_i$ of the output voltage of the storage device 30 is "$T_k \leq V_i < T_{k+1}$" (k is an integer of 0 or more and equal to or less than N−3). For example, if N is 2, the inference weight storage circuit 72 can be used as a binary weight circuit. As a result, the arithmetic circuit 71 can execute the arithmetic operation at high speed in accordance with the neural network with the analog circuit using a plurality of inference weights, each of which is expressed with an N value. The inference weight storage circuit 72 may be incorporated into the arithmetic circuit 71.

The learning weight storage circuit 73 stores a plurality of weights corresponding to the respective inference weights in learning processing of the neural network. The learning weight storage circuit 73 stores, for example, L weights $(w_1, \ldots, w_L)$ corresponding to L inference weights one by one. Each of the weights is a continuous value (for example, an analog value or a digital value of a predetermined number of bits). The learning weight storage circuit 73 transmits the weights $(w_1, \ldots, w_L)$ to the inference weight storage circuit 72.

The learning control circuit 74 stores initial values of the weights in the learning weight storage circuit 73 in learning processing of the neural network. The learning control circuit 74 repeats update processing a plurality of times. In the update processing, the learning control circuit 74 generates update amounts $(\Delta w_1, \ldots, \Delta w_L)$ corresponding to the respective weights on the basis of the arithmetic operation results acquired by the arithmetic circuit 71, and transmits the update amounts to the learning weight storage circuit 73. The learning weight storage circuit 73 updates the weights stored therein on the basis of the update amounts. The learning control circuit 74 may execute the update processing only once. After the learning processing, the learning control circuit 74 stores a plurality of values corresponding to the respective weights stored in the learning weight storage circuit 73 as a plurality of inference weights in the inference weight storage circuit 72.

As described above, the learning control circuit 74 executes learning processing of the neural network using a plurality of weights represented with continuous values. As a result, the learning control circuit 74 can increase/decrease each of the weights by a minute amount in the learning processing, and execute learning of the neural network with accuracy.

6. 2 Structure of Layers of Neural Network

The following is an explanation of an example of a structure of layers of the neural network. FIG. 14 is a diagram for explaining a layer of the neural network in the neural network apparatus 70.

As illustrated in FIG. 14, the neural network includes, for example, one or a plurality of layers. The arithmetic circuit 71 includes a circuit executing arithmetic operations corresponding to the layer as illustrated in FIG. 14.

To execute arithmetic operations for the layer, the arithmetic circuit 71 includes N sum-of-product arithmetic circuits 80 (80_1 to 80_N) corresponding to N (N is an integer of 2 or more) intermediate signals $(y_1$ to $y_N)$. The j-th (j is an integer of 1 or more and equal to or less than N) sum-of-product arithmetic circuit 80_j in the N sum-of-product arithmetic circuits 80 corresponds to the j-th intermediate signal $(y_j)$. Each of the N sum-of-product arithmetic circuits 80 receives M input signals $(x_1$ to $x_M)$.

6. 3 Sum-of-Product Arithmetic Operation with Sum-of-Product Arithmetic Circuit The following is an explanation of a sum-of-product arithmetic operation with the sum-of-product arithmetic circuit 80. FIG. 15 is a diagram for explaining a sum-of-product arithmetic operation with the sum-of-product arithmetic circuit 80.

As illustrated in FIG. 15, each of the N sum-of-product arithmetic circuits 80 is provided with M inference weights $(w_{1j}, w_{2j}, \ldots, w_{ij}, \ldots, w_{Mj})$ corresponding to the M input signals from the inference weight storage circuit 72.

Each of the N sum-of-product arithmetic circuits 80 outputs an intermediate signal acquired by binarizing a value acquired by sum-of-product arithmetic operation of the M input signals and the M inference weights. For example, the sum-of-product arithmetic circuit 80_j corresponding to the j-th intermediate signal executes an arithmetic operation of the expression (1) in an analog manner.

$$y_i = f\left(\sum_{i=1}^{M} x_i w_{ij}\right) \tag{1}$$

In the expression (1), $y_j$ indicates the j-th intermediate signal. $x_i$ indicates an i-th (i is an integer of 1 or more and equal to or less than M) input signal. $w_{ij}$ indicates an inference weight to be multiplied by the i-th input signal in the M inference weights. In the expression (1), f (X) indicates a function binazying the value X in the parentheses with a predetermined threshold. Furthermore, a bias being a constant may be further added to $y_j$.

6. 4 Effects According to Present Embodiment

The neural network apparatus 70 according to the present embodiment stores inference weights used for arithmetic operations executed in the neural network in the storage device 30 using the resistance change elements 10 explained in the first to the fifth embodiments. As a result, the neural network apparatus 70 can store inference weights in the resistance change element 10 with small characteristic variations, and execute arithmetic operations with high accuracy.

7. Seventh Embodiment

The following is an explanation of a neural network apparatus 70 according to a seventh embodiment. The seventh embodiment illustrates a configuration of the neural network apparatus 70 difference from that of the sixth embodiment. The following explanation mainly illustrates points different from those of the sixth embodiment.

7. 1 Configuration of Neural Network Apparatus

First, the following is an explanation of an example of the configuration of the neural network apparatus 70. FIG. 16 is a diagram illustrating an example of the configuration of the neural network apparatus 70 according to the seventh embodiment.

As illustrated in FIG. 16, the neural network apparatus 70 includes an arithmetic circuit 71, a learning weight storage circuit 73, and a learning control circuit 74.

The arithmetic circuit 71 executes an arithmetic operation in accordance with a neural network. The arithmetic circuit 71 is achieved with, for example, an electric circuit including an analog circuit. For example, the arithmetic circuit 71 receives M (M is an integer of 2 or more) input signals $(x_1, \ldots, x_M)$, and outputs an output signal (z). The arithmetic circuit 71 may output a plurality of output signals.

The learning weight storage circuit 73 stores a plurality of weights corresponding to respective inference weights in learning processing of the neural network. The learning weight storage circuit 73 includes a plurality of storage devices 30 corresponding to the respective weights. Specifically, the learning weight storage circuit 73 includes a plurality of resistance change elements 10 storing respective inference weights. The learning weight storage circuit 73 stores, for example, L weights (w$_1$, . . . , w$_L$) corresponding to L inference weights one by one. Each of the weights is a continuous value (for example, an analog value or a digital value of a predetermined number of bits). The learning weight storage circuit 73 transmits the weights to the arithmetic circuit 71. The arithmetic circuit 71 uses output values (weights) of the learning weight storage circuit 73 without any processing.

The learning control circuit 74 stores initial values of the weights in the learning weight storage circuit 73 in learning processing of the neural network. Thereafter, the learning control circuit 74 repeats update processing a plurality of times. In the update processing, the learning control circuit 74 generates update amounts (Δw$_1$, . . . , Δw$_L$) corresponding to the respective weights on the basis of the arithmetic operation results acquired by the arithmetic circuit 71, and transmits the update amounts to the learning weight storage circuit 73. The learning weight storage circuit 73 updates the respective weights stored therein on the basis of the update amounts. The learning control circuit 74 may execute the update processing only once.

7. 2 Effects of Present Embodiment

The neural network apparatus 70 according to the present embodiment stores weights used for arithmetic operations executed in the neural network in the storage device 30 using the resistance change elements 10 explained in the first to the fifth embodiments. The learning control circuit 74 executes learning processing of the neural network using a plurality of weights represented with continuous values. As a result, the learning control circuit 74 can increase/decrease each of the weights by a minute amount in the learning processing, and execute learning of the neural network with accuracy.

8. Modification and the Like

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A storage device comprising:
a resistance change element including:
  a first electrode;
  a second electrode;
  a first transition metal compound layer provided between the first electrode and the second electrode and including lithium ions in lattice site locations;
  a second transition metal compound layer provided between the first transition metal compound layer and the second electrode and including the lithium ions in the lattice site locations; and a lithium ion conductor layer provided between the first transition metal compound layer and the second transition metal compound layer and being a solid material allowing the lithium ions to pass therethrough and resistant to electrons;
a control circuit connected to the resistance change element and configured to control a write operation and a read operation using the resistance change element;
an output circuit connected to the resistance change element and configured to output an output voltage based on the read operation; and
a first circuit configured to couple the output circuit to one of the first electrode and the second electrode of the resistance change element, wherein
in the read operation, the first circuit switches from a state in which an input pulse is applied to the first electrode and the second electrode is coupled to the output circuit to a state in which the input pulse is applied to the second electrode and the first electrode is coupled to the output circuit.
2. The storage device according to claim 1, further comprising:
a second circuit configured to be capable of short-circuiting the first electrode and the second electrode, wherein
in the read operation, the second circuit short-circuits the first electrode and the second electrode after application of an input pulse to the resistance change element is finished.
3. The storage device according to claim 1, wherein
the output circuit includes a transistor including a gate coupled to the second electrode of the resistance change element,
in the read operation, a normal rotation pulse and a reverse rotation pulse acquired by reversing the normal rotation pulse are alternately applied to the first electrode of the resistance change element, and
in case where the normal rotation pulse is applied to the first electrode, the output circuit outputs a first voltage when the resistance change element is in a low resistive state, and the output circuit outputs a second voltage lower than the first voltage when the resistance change element is in a high resistive state.
4. The storage device according to claim 1, wherein the first transition metal compound layer contains at least one of a rock salt type transition metal oxide and a spinel type transition metal oxide.
5. The storage device according to claim 4, wherein the rock salt type transition metal oxide contains at least one of $LiTiO_2$, $Li_7Ti_5O_{12}$, $Li_2[CrTi]O_4$, and $(Li_{3/2}Fe_{1/2})[Li_{1/2}Fe_{1/2}Ti]O_4$.
6. The storage device according to claim 4, wherein the spinel type transition metal oxide contains at least one of $LiTi_2O_4$, $Li_4T_{15}O_{12}$, $Li[CrTi]O_4$, and $(Li_{1/2}Fe_{1/2})[Li_{1/2}Fe_{1/2}Ti]O_4$.
7. The storage device according to claim 1, wherein the second transition metal compound layer contains at least one of a rock salt type transition metal oxide $Li_7Ti_5O_{12}$ and a spinel type transition metal oxide $Li_4Ti_5O_{12}$.
8. The storage device according to claim 1, wherein the second transition metal compound layer is a mixture of a λ type cubic metal oxide $\lambda MnO_2$ and a spinel type transition metal oxide $Li_{1/2}MnO_2$.
9. The storage device according to claim 1, wherein composition of the lithium ions in the second transition metal compound layer is lower than composition of the lithium ions in the first transition metal compound layer.

10. The storage device according to claim 1, wherein a film thickness of the second transition metal compound layer is thinner than a film thickness of the first transition metal compound layer.

11. The storage device according to claim 1, wherein a film thickness of the second transition metal compound layer is equal to or thicker than a film thickness of the first transition metal compound layer.

12. The storage device according to claim 1 changing to a low resistive state or a high resistive state based on composition of the lithium ions included in the second transition metal compound layer.

13. The storage device according to claim 1, wherein the first transition metal compound layer is in contact with a first surface of the lithium ion conductor layer, and the second transition metal compound layer is in contact with a second surface opposite to the first surface of the lithium ion conductor layer.

14. The storage device according to claim 13, wherein the first surface has a shape equal to a shape of the second surface.

15. The storage device according to claim 1, wherein, when the resistance change element is set to a low resistive state in the write operation, the control circuit applies a pulse of a positive voltage higher than a voltage of the second electrode to the first electrode.

16. A storage device comprising:

a resistance change element including:

a first electrode;

a second electrode;

a first transition metal compound layer provided between the first electrode and the second electrode, including lithium ions, and containing at least one of a rock salt type transition metal oxide and a spinel type transition metal oxide;

a second transition metal compound layer provided between the first transition metal compound layer and the second electrode and containing at least one of $Li_7Ti_5O_{12}$ and $Li_4Ti_5O_{12}$; and a lithium ion conductor layer provided between the first transition metal compound layer and the second transition metal compound layer and being a solid material allowing the lithium ions to pass therethrough and resistant to electrons;

a control circuit connected to the resistance change element and configured to control a write operation and a read operation using the resistance change element;

an output circuit connected to the resistance change element and configured to output an output voltage based on the read operation; and a first circuit configured to couple the output circuit to one of the first electrode and the second electrode of the resistance change element, wherein in the read operation, the first circuit switches from a state in which an input pulse is applied to the first electrode and the second electrode is coupled to the output circuit to a state in which the input pulse is applied to the second electrode and the first electrode is coupled to the output circuit.

* * * * *